(12) United States Patent
Ko et al.

(10) Patent No.: US 12,080,553 B2
(45) Date of Patent: Sep. 3, 2024

(54) SEMICONDUCTOR DEVICE AND METHOD OF MANUFACTURE

(71) Applicant: Taiwan Semiconductor Manufacturing Co., Ltd., Hsinchu (TW)

(72) Inventors: Chung-Ting Ko, Kaohsiung (TW); Sung-En Lin, Hsinchu County (TW); Chi On Chui, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 291 days.

(21) Appl. No.: 17/353,380

(22) Filed: Jun. 21, 2021

(65) Prior Publication Data

US 2022/0367187 A1 Nov. 17, 2022

Related U.S. Application Data

(60) Provisional application No. 63/188,150, filed on May 13, 2021.

(51) Int. Cl.
*H01L 21/768* (2006.01)
*H01L 21/02* (2006.01)
(Continued)

(52) U.S. Cl.
CPC .... *H01L 21/0338* (2013.01); *H01L 21/02181* (2013.01); *H01L 21/0234* (2013.01);
(Continued)

(58) Field of Classification Search
CPC .......................... H01L 21/02667–02691; H01L 27/1274–1285; H01L 29/7855–7856;
(Continued)

(56) References Cited

U.S. PATENT DOCUMENTS

| | | | |
|---|---|---|---|
| 10,002,933 B1 * | 6/2018 | Tang | H01L 29/42376 |
| 10,050,149 B1 | 8/2018 | Huang et al. | |
| 10,269,940 B2 | 4/2019 | Young et al. | |
| 10,937,783 B2 | 3/2021 | Chang et al. | |
| 11,004,725 B2 | 5/2021 | Lin et al. | |
| 11,171,236 B2 | 11/2021 | Wang et al. | |

(Continued)

FOREIGN PATENT DOCUMENTS

| | | |
|---|---|---|
| KR | 20180060918 A | 6/2018 |
| KR | 20180127156 A | 11/2018 |

(Continued)

OTHER PUBLICATIONS

Won Joon Choi et al. "Annealing Effects of HfO2 Gate Thin Films Formed by Inductively Coupled Sputtering Technique at Room Temperature," J. Korean Phys. Soc. 45(9(6)), 716-719, 2004 (Year: 2004).*

*Primary Examiner* — Eric A. Ward
*Assistant Examiner* — Nora Taylor Nix
(74) *Attorney, Agent, or Firm* — Slater Matsil, LLP

(57) ABSTRACT

Structures and methods of forming semiconductor devices are presented in which a void-free core-shell hard mask is formed over a gate electrode. The void-free core-shell hard mask may be formed in some embodiments by forming a first liner layer over the gate electrode, forming a void-free material over the first liner layer, recessing the void-free material, and forming a second liner over the recessed void-free material.

20 Claims, 29 Drawing Sheets

(51) Int. Cl.
*H01L 21/033* (2006.01)
*H01L 29/66* (2006.01)

(52) U.S. Cl.
CPC .... *H01L 21/02356* (2013.01); *H01L 21/0332* (2013.01); *H01L 21/0335* (2013.01); *H01L 21/0337* (2013.01); *H01L 21/76805* (2013.01); *H01L 21/76895* (2013.01); *H01L 29/66795* (2013.01)

(58) Field of Classification Search
CPC ..... H01L 21/823431; H01L 21/823821; H01L 21/845; H01L 27/0924; H01L 27/1211; H01L 29/41791; H01L 29/66795–66818; H01L 29/785–7856; H01L 2029/7857–7858; H01L 29/36–365; H01L 21/76841–76876; H01L 23/53223; H01L 23/53238; H01L 23/53266; H01L 23/552–556; H01L 23/562; H01L 23/57–576; H01L 23/60; H01L 23/62; H01L 27/0248–0296; H01L 29/66545; H01L 27/0886; H01L 2924/13067; H01L 29/04–045; H01L 29/16–1608; H01L 29/18–185; H01L 29/22–2206; H10B 12/36; H10B 12/056

See application file for complete search history.

(56) References Cited

U.S. PATENT DOCUMENTS

| | | | |
|---|---|---|---|
| 11,201,084 B2 | 12/2021 | Chen et al. | |
| 2004/0152269 A1* | 8/2004 | Hergenrother | H01L 21/823487 257/E21.629 |
| 2007/0138573 A1* | 6/2007 | Kashihara | H01L 29/6653 438/300 |
| 2008/0009111 A1* | 1/2008 | Fukutome | H01L 21/823814 257/E21.345 |
| 2018/0151557 A1 | 5/2018 | Tanabe et al. | |
| 2019/0355827 A1 | 11/2019 | Ching et al. | |
| 2019/0393234 A1* | 12/2019 | Lin | H01L 29/66825 |
| 2020/0035693 A1* | 1/2020 | Hisamoto | H10B 41/46 |
| 2020/0105937 A1* | 4/2020 | Yu | H01L 29/6653 |
| 2020/0135475 A1* | 4/2020 | Cheng | H01L 21/823842 |
| 2021/0020771 A1* | 1/2021 | Weng | H01L 27/0886 |
| 2021/0125856 A1* | 4/2021 | Ahn | H01L 21/76801 |
| 2021/0134969 A1 | 5/2021 | Huang et al. | |
| 2022/0020594 A1* | 1/2022 | Jiang | H01L 21/32136 |

FOREIGN PATENT DOCUMENTS

| | | |
|---|---|---|
| KR | 20190003283 A | 1/2019 |
| KR | 20210024404 A | 3/2021 |
| TW | 202021044 A | 6/2020 |
| TW | 202046505 A | 12/2020 |

* cited by examiner

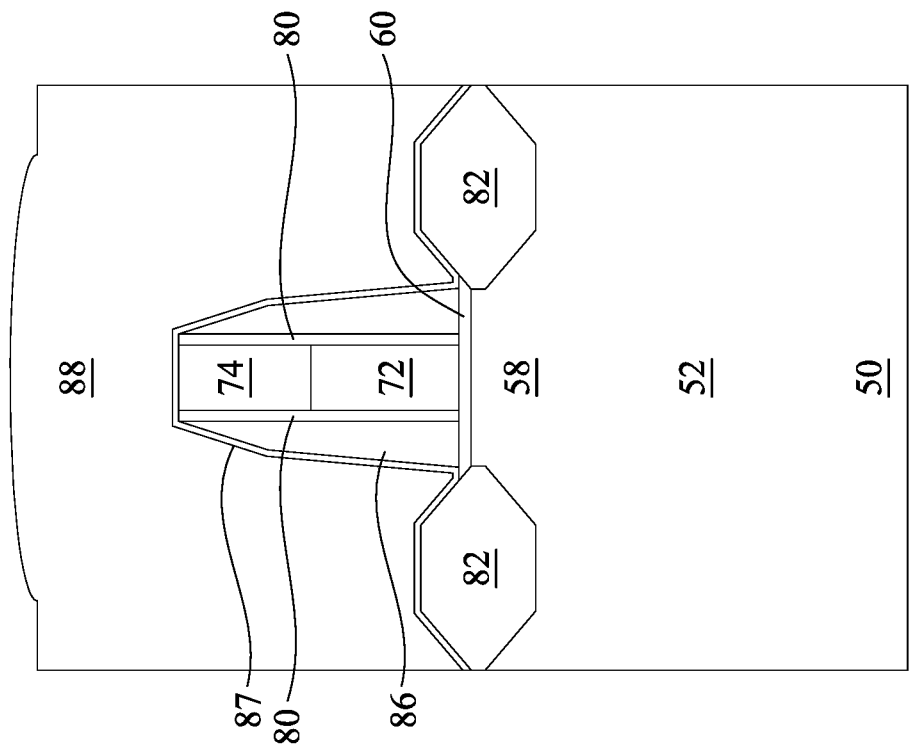
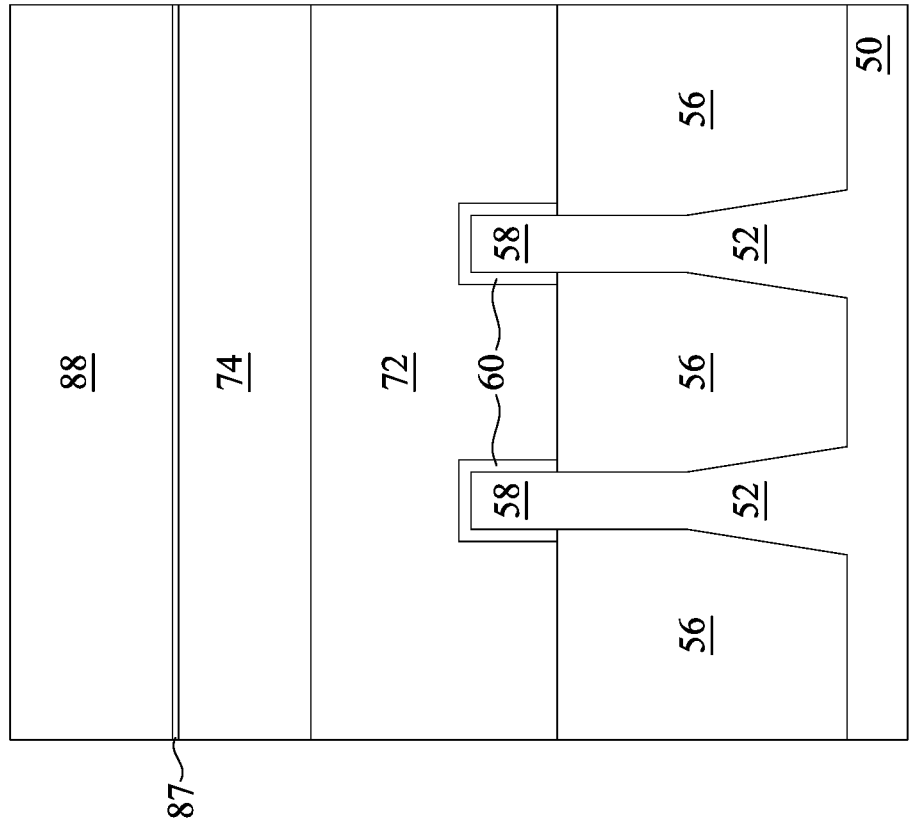
Fig. 11B
Fig. 11A

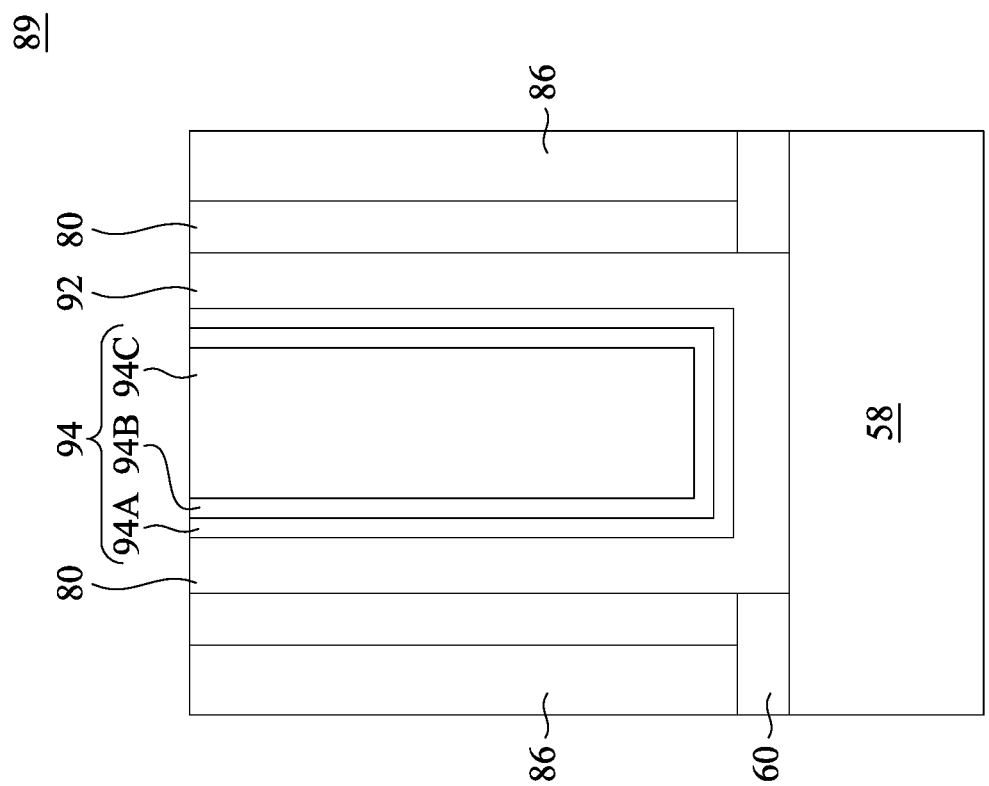

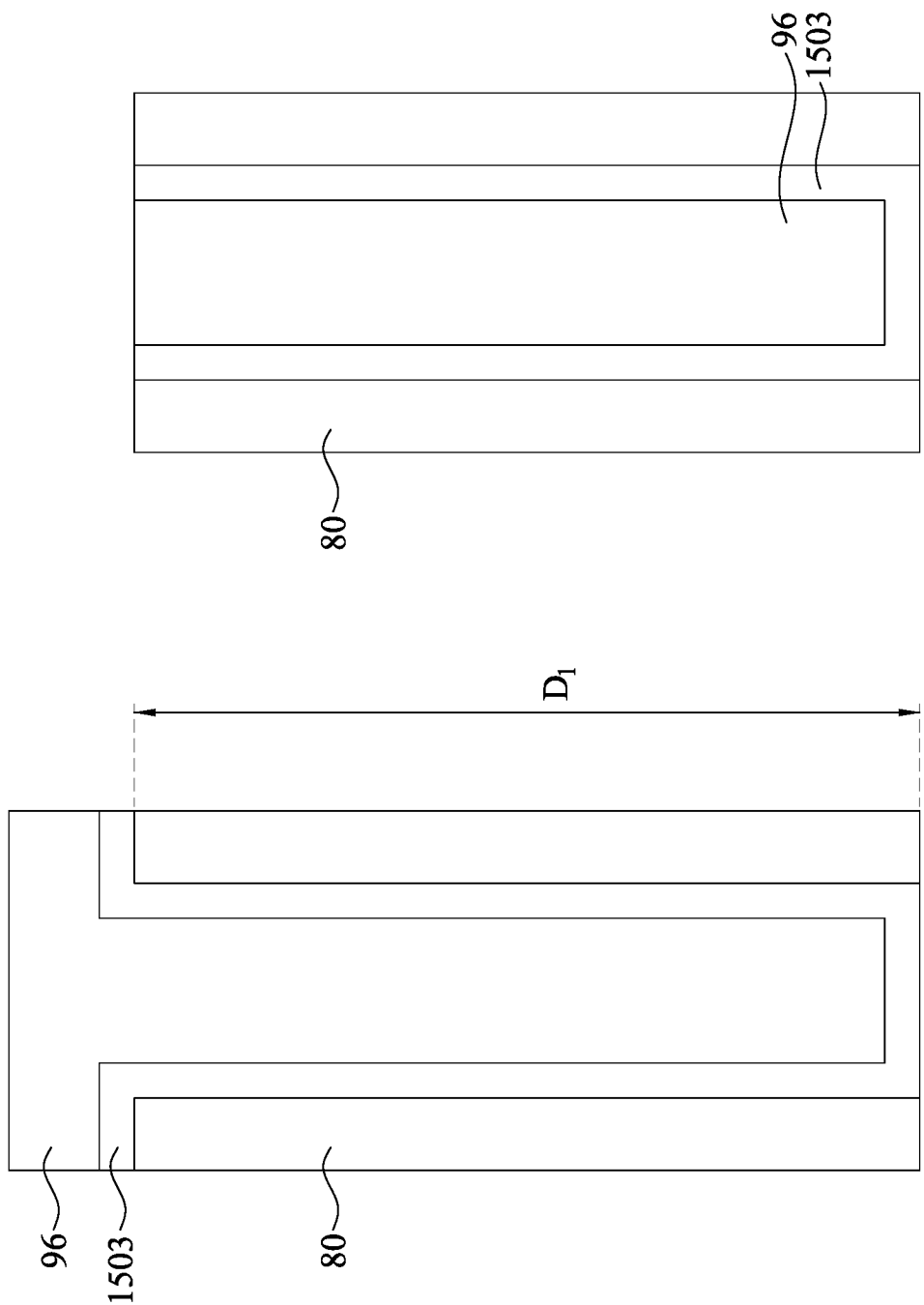

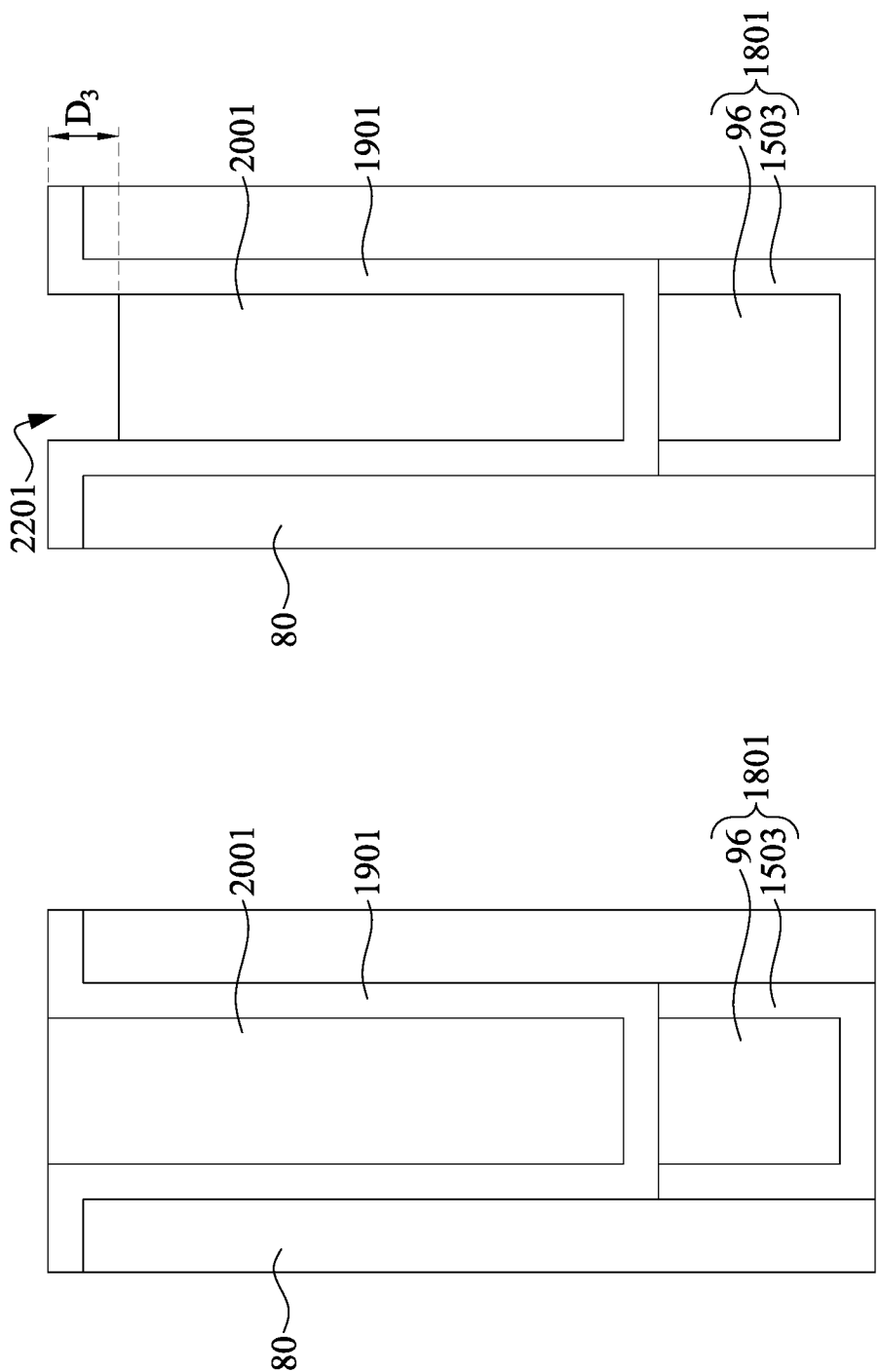

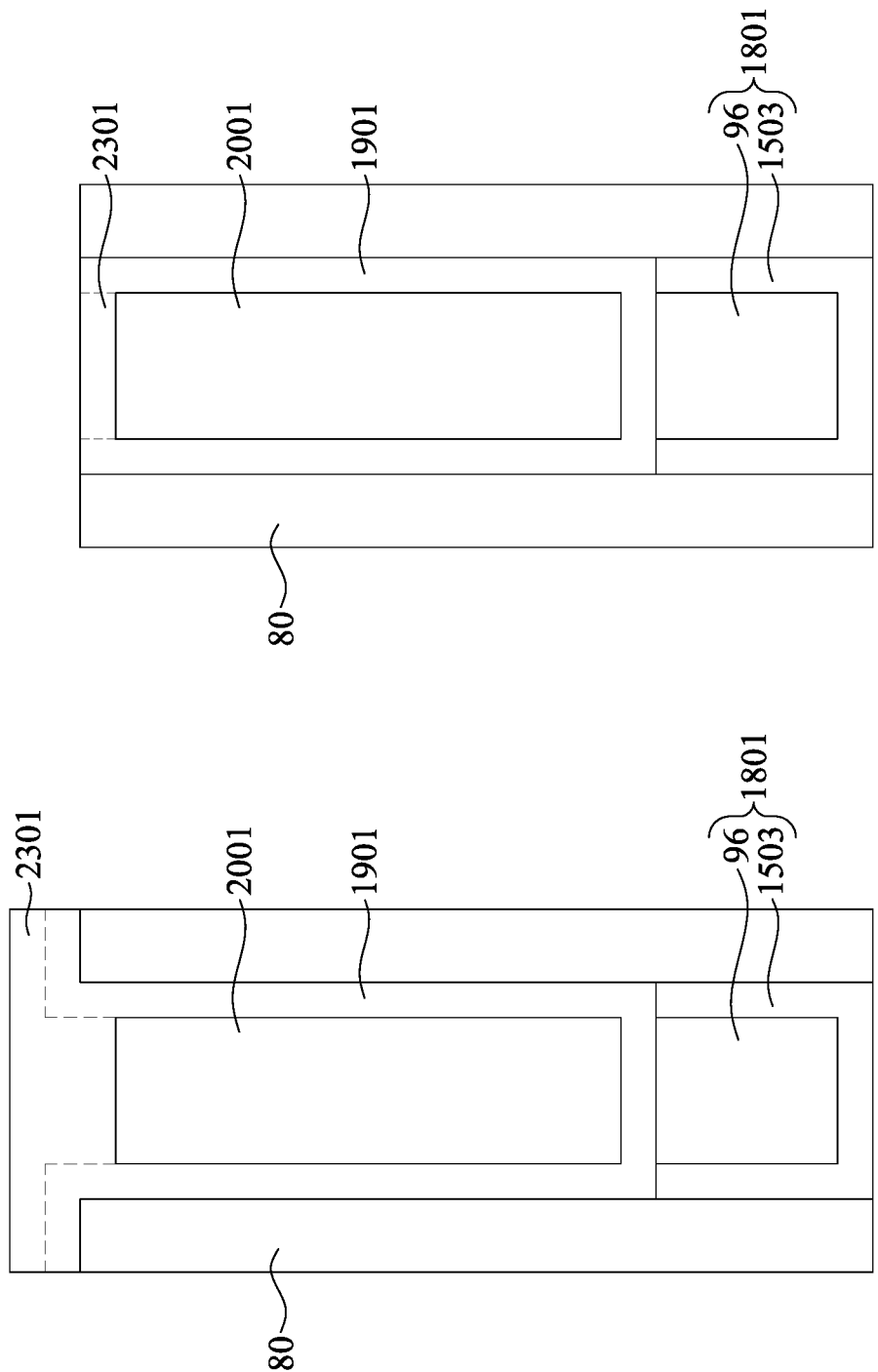

SEMICONDUCTOR DEVICE AND METHOD OF MANUFACTURE

PRIORITY CLAIM

This application claims the benefit of U.S. Provisional Application No. 63/188,150, filed on May 13, 2021, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6, 7, 8A, 8B, 9A, 9B, 10A, 10B, 10C, 10D, 11A, 11B, 12A, 12B, 13A, 13B, 14A, 14B, 14C, 15A, 15B, 15C, 16, 17, 18, 19, 20, 21, 22, 23, 24, 25, 26, 27, 28, 29, 30, 31, 32, 33, 34A, 34B and 34C are cross-sectional views of intermediate stages in the manufacturing of FinFETs, in accordance with some embodiments.

DETAILED DESCRIPTION

Figure 1:
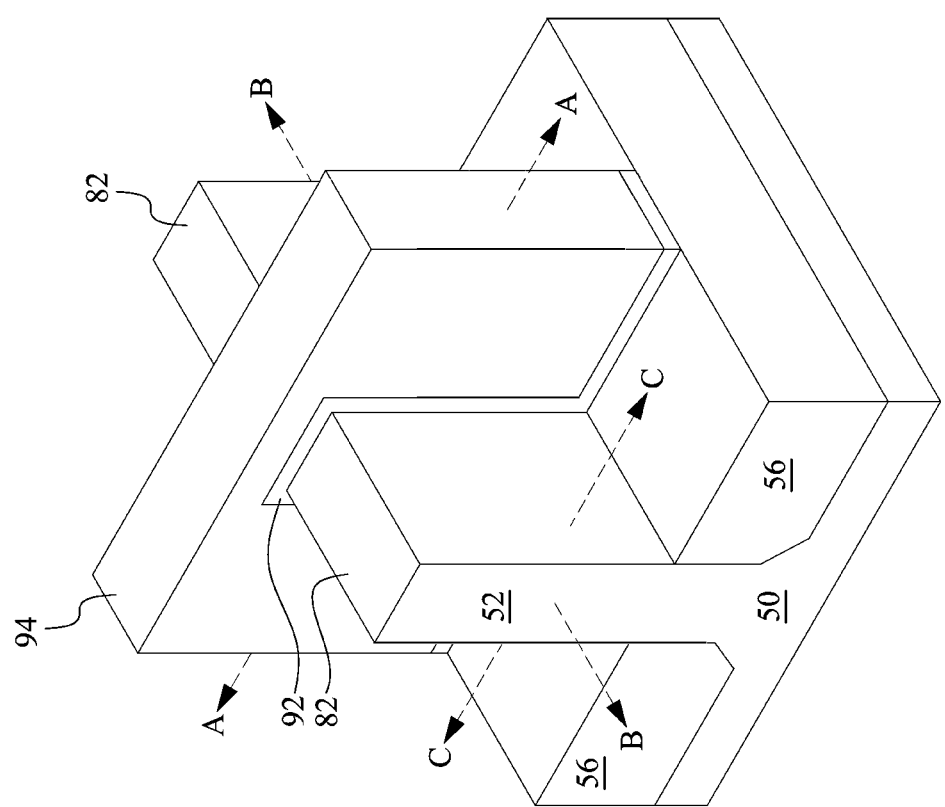
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to structures and methods of forming semiconductor devices in which a void-free core-shell hard mask is formed over a gate electrode for a fin field effect transistor (FinFET) in 16 nanometer technology nodes and beyond. The embodiments described herein, however, are intended to be illustrative and are not intended to be limiting, as the ideas presented herein may be implemented in a wide variety of embodiments, and all such embodiments are fully intended to be included within the scope.

FIG. 1 illustrates an example of a FinFET in a three-dimensional view, in accordance with some embodiments. The FinFET comprises a fin 52 on a substrate 50 (e.g., a semiconductor substrate). Isolation regions 56 are disposed in the substrate 50, and the fin 52 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring isolation regions 56.

A gate dielectric layer 92 is along sidewalls and over a top surface of the fin 52, and a gate electrode 94 is over the gate dielectric layer 92. Source/drain regions 82 are disposed in opposite sides of the fin 52 with respect to the gate dielectric layer 92 and gate electrode 94. FIG. 1 further illustrates reference cross-sections that are used in later figures. Cross-section A-A is along a longitudinal axis of the gate electrode 94 and in a direction, for example, perpendicular to the direction of current flow between the source/drain regions 82 of the FinFET. Cross-section B-B is perpendicular to cross-section A-A and is along a longitudinal axis of the fin 52 and in a direction of, for example, a current flow between the source/drain regions 82 of the FinFET. Cross-section C-C is parallel to cross-section A-A and extends through a source/drain region of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs, nanostructure (e.g., nanosheet, nanowire, gate-all-around, or the like) field effect transistors (NSFETs), or the like.

FIGS. 2 through 15C are cross-sectional views of intermediate stages in the manufacturing of FinFETs, in accordance with some embodiments. FIGS. 2 through 7 illustrate reference cross-section A-A illustrated in FIG. 1, except for multiple fins/FinFETs. FIGS. 8A, 9A, 10A, 11A, 12A, 13A, 14A, and 15A are illustrated along reference cross-section A-A illustrated in FIG. 1, and FIGS. 8B, 9B, 10B, 11B, 12B, 13B, 14B, 14C, and 15B are illustrated along a similar cross-section B-B illustrated in FIG. 1, except for multiple fins/FinFETs. FIGS. 10C and 10D are illustrated along reference cross-section C-C illustrated in FIG. 1, except for multiple fins/FinFETs.

Figure 2:
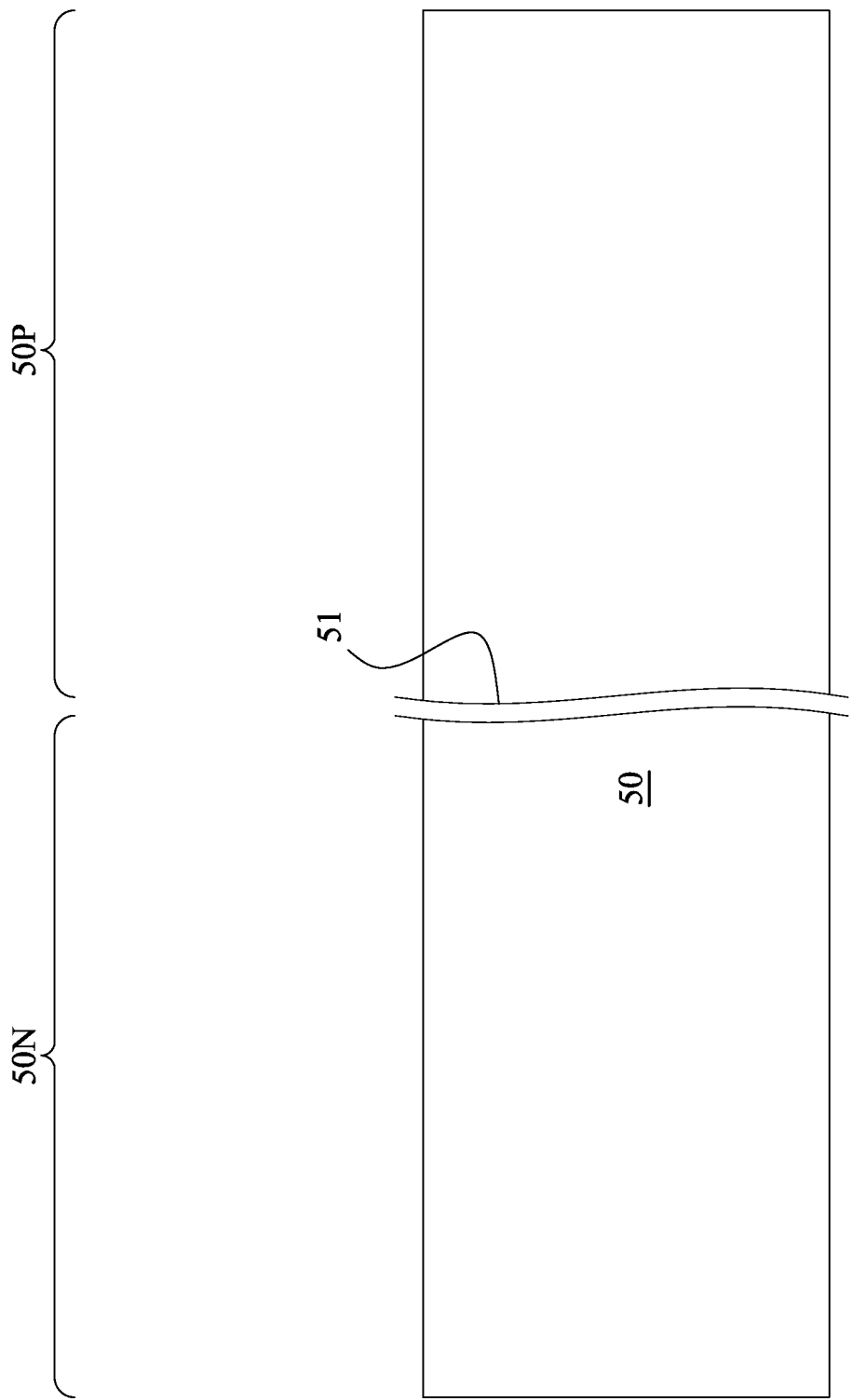

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type FinFETs. The p-type region 50P can be for forming p-type devices, such as PMOS transistors, e.g., p-type FinFETs. The n-type region 50N may be physically separated from the p-type region 50P (as illustrated by divider 51), and any number of device features (e.g., other active devices, doped regions, isolation structures, etc.) may be disposed between the n-type region 50N and the p-type region 50P.

Figure 3:
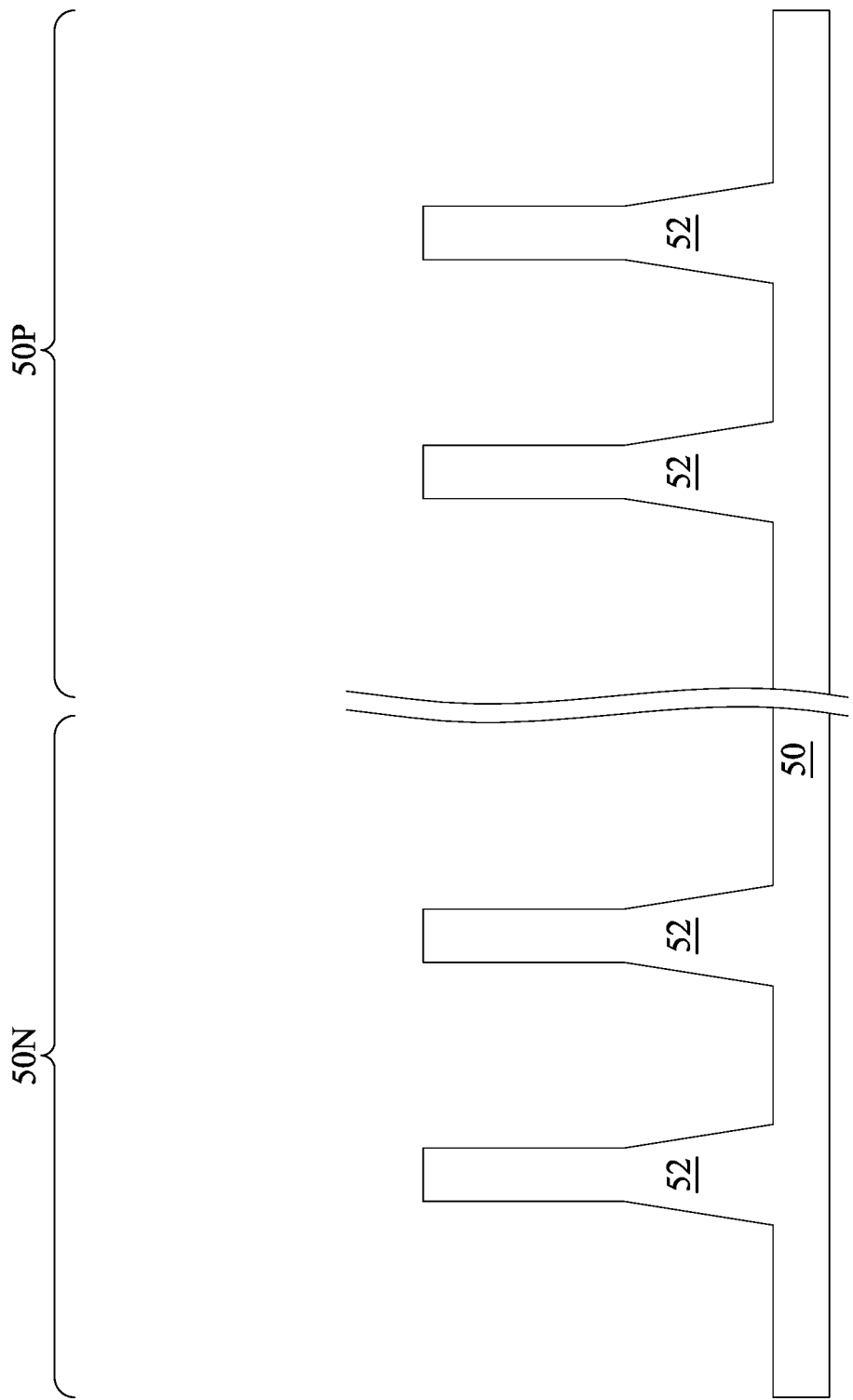

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

The fins may be patterned by any suitable method. For example, the fins 52 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. In some embodiments, the mask (or other layer) may remain on the fins 52.

Figure 4:
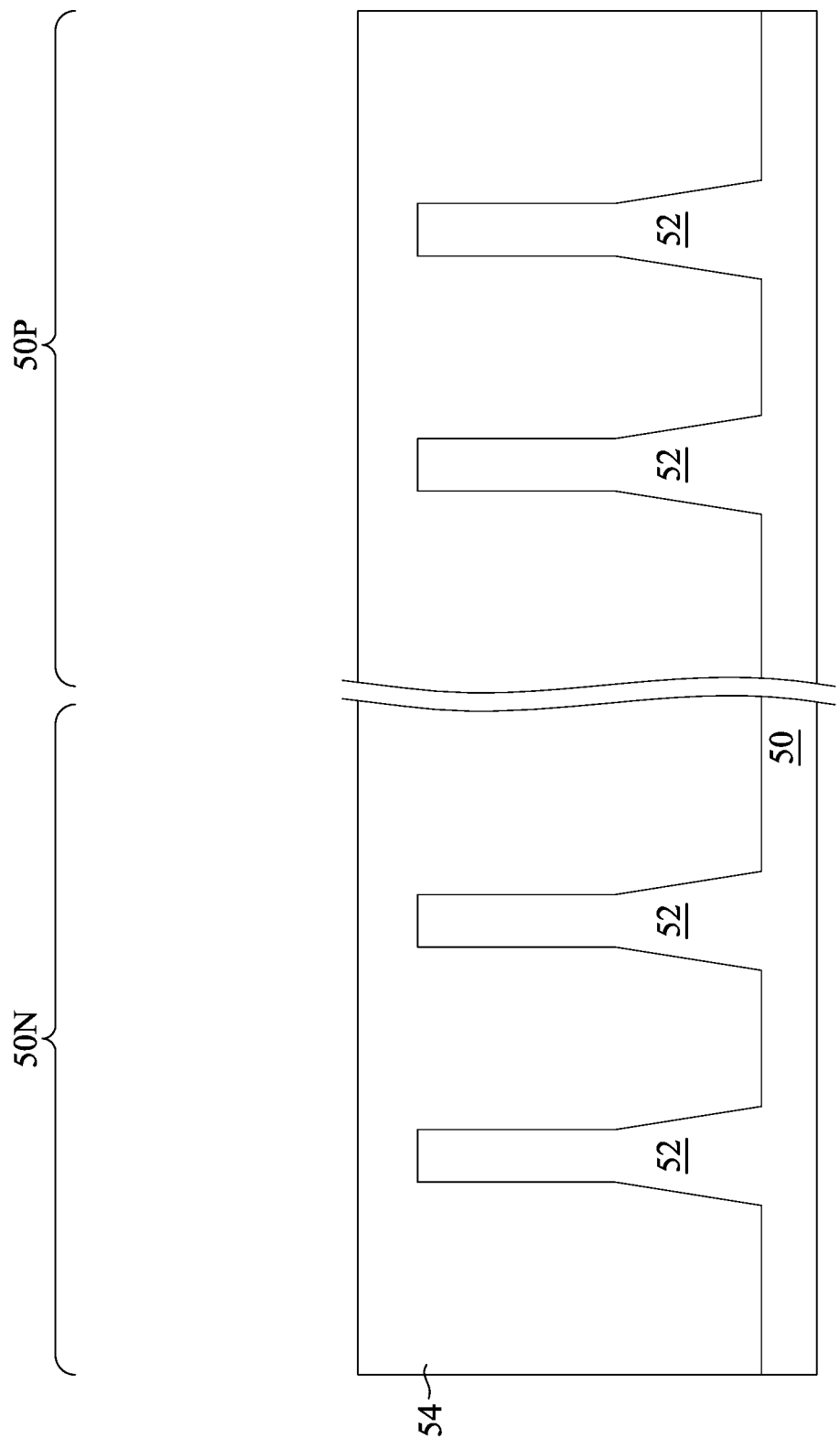

In FIG. 4, an insulation material 54 is formed over the substrate 50 and between neighboring fins 52. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 52. Although the insulation material 54 is illustrated as a single layer, some embodiments may utilize multiple layers. For example, in some embodiments a liner (not shown) may first be formed along a surface of the substrate 50 and the fins 52. Thereafter, a fill material, such as those discussed above may be formed over the liner.

Figure 5:
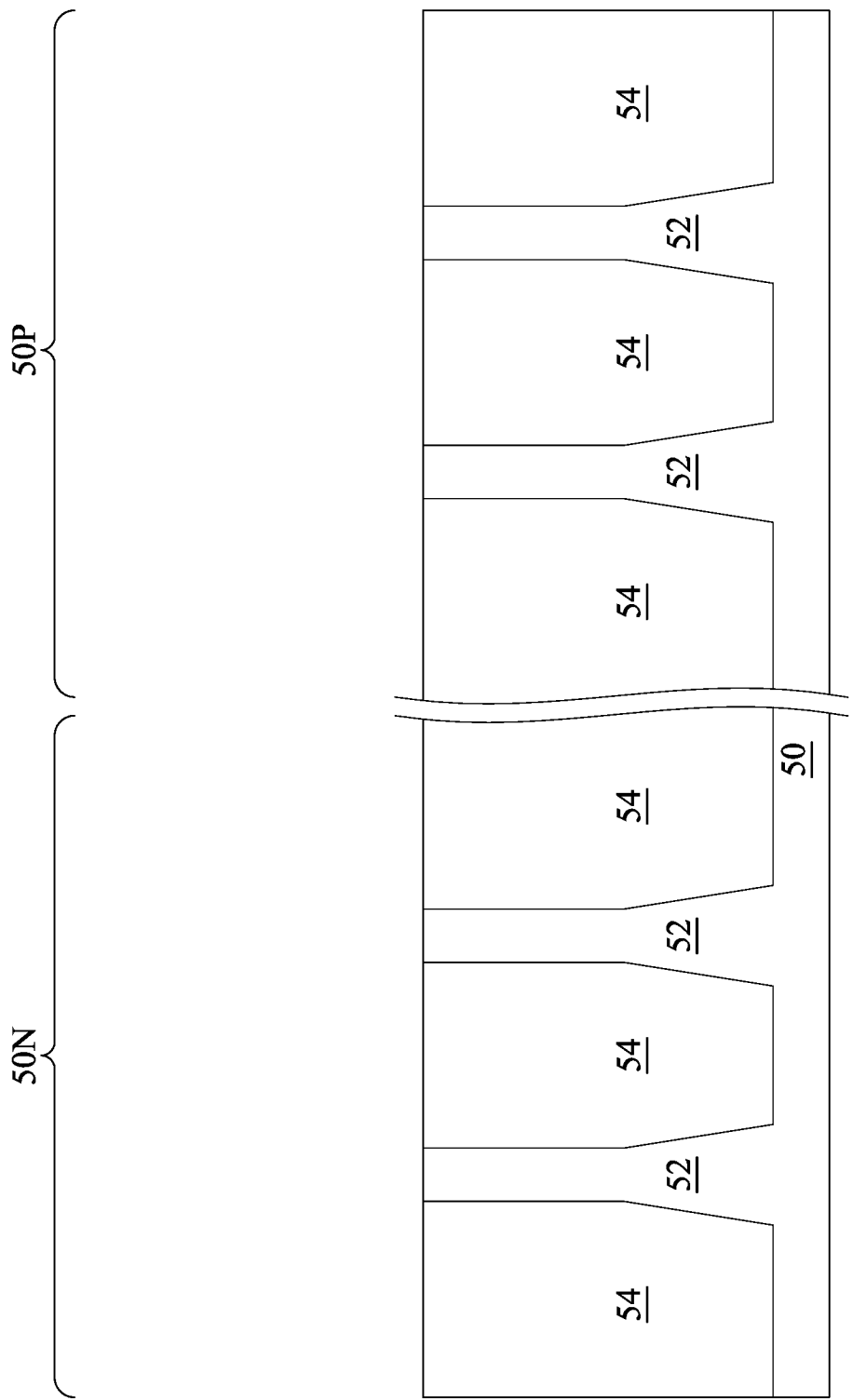

In FIG. 5, a removal process is applied to the insulation material 54 to remove excess insulation material 54 over the fins 52. In some embodiments, a planarization process such as a chemical mechanical polish (CMP), an etch-back process, combinations thereof, or the like may be utilized. The planarization process exposes the fins 52 such that top surfaces of the fins 52 and the insulation material 54 are level after the planarization process is complete. In embodiments in which a mask remains on the fins 52, the planarization process may expose the mask or remove the mask such that top surfaces of the mask or the fins 52, respectively, and the insulation material 54 are level after the planarization process is complete.

Figure 6:
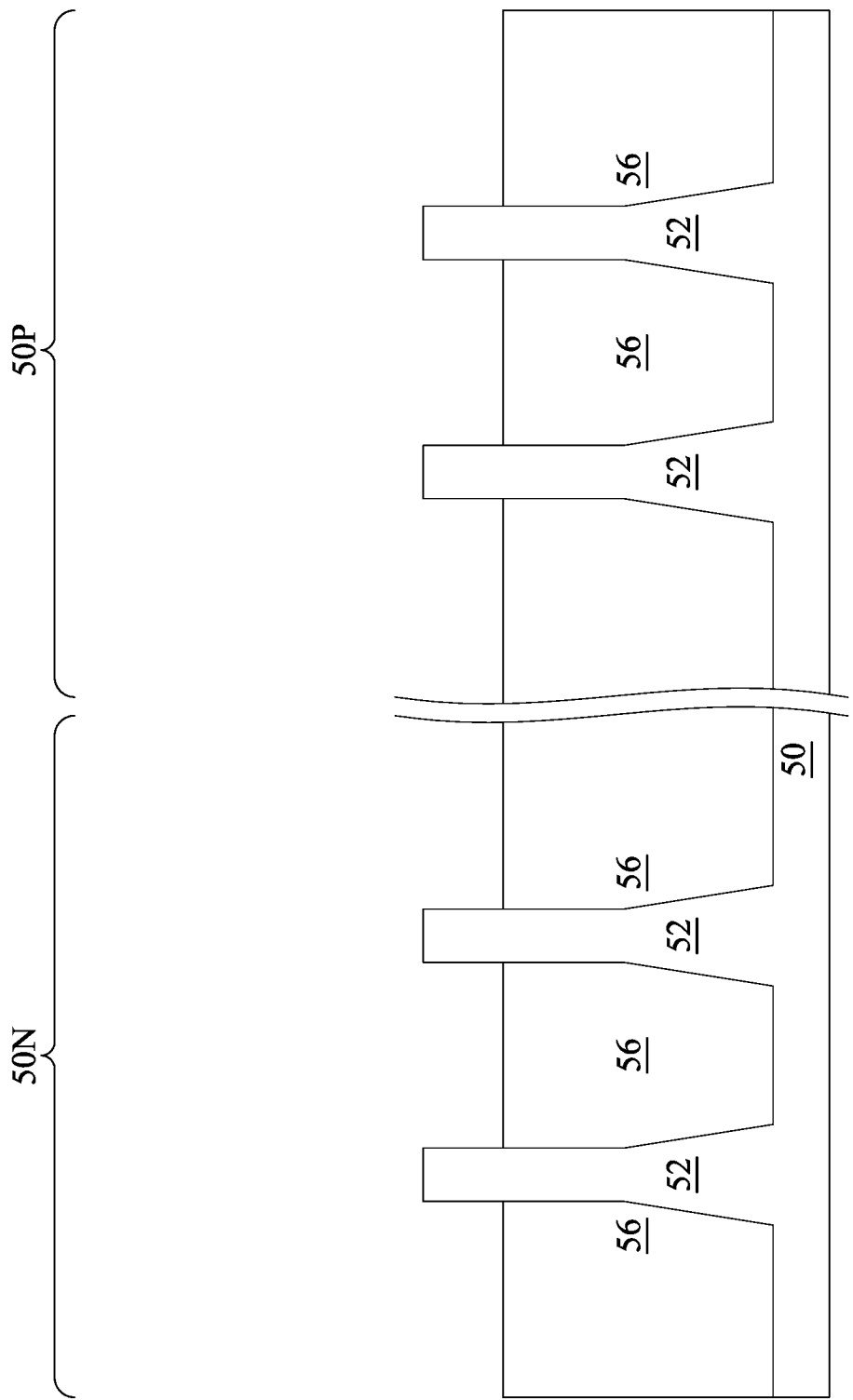

In FIG. 6, the insulation material 54 is recessed to form Shallow Trench Isolation (STI) regions 56. The insulation material 54 is recessed such that upper portions of fins 52 in the n-type region 50N and in the p-type region 50P protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., etches the material of the insulation material 54 at a faster rate than the material of the fins 52). For example, an oxide removal using, for example, dilute hydrofluoric (dHF) acid may be used.

The process described with respect to FIGS. 2 through 6 is just one example of how the fins 52 may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 52. For example, the fins 52 in FIG. 5 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in n-type region 50N (e.g., an NMOS region) different from the material in p-type region 50P (e.g., a PMOS region). In various embodiments, upper portions of the fins 52 may be formed from silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further in FIG. 6, appropriate wells (not shown) may be formed in the fins 52 and/or the substrate 50. In some embodiments, a P well may be formed in the n-type region 50N, and an N well may be formed in the p-type region 50P. In some embodiments, a P well or an N well are formed in both the n-type region 50N and the p-type region 50P.

In the embodiments with different well types, the different implant steps for the n-type region 50N and the p-type region 50P may be achieved using a photoresist and/or other masks (not shown). For example, a photoresist may be formed over the fins 52 and the STI regions 56 in the n-type region 50N. The photoresist is patterned to expose the p-type region 50P of the substrate 50. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist is removed, such as by an acceptable ashing process.

Following the implanting of the p-type region 50P, a photoresist is formed over the fins 52 and the STI regions 56 in the p-type region 50P. The photoresist is patterned to expose the n-type region 50N of the substrate 50. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 7:
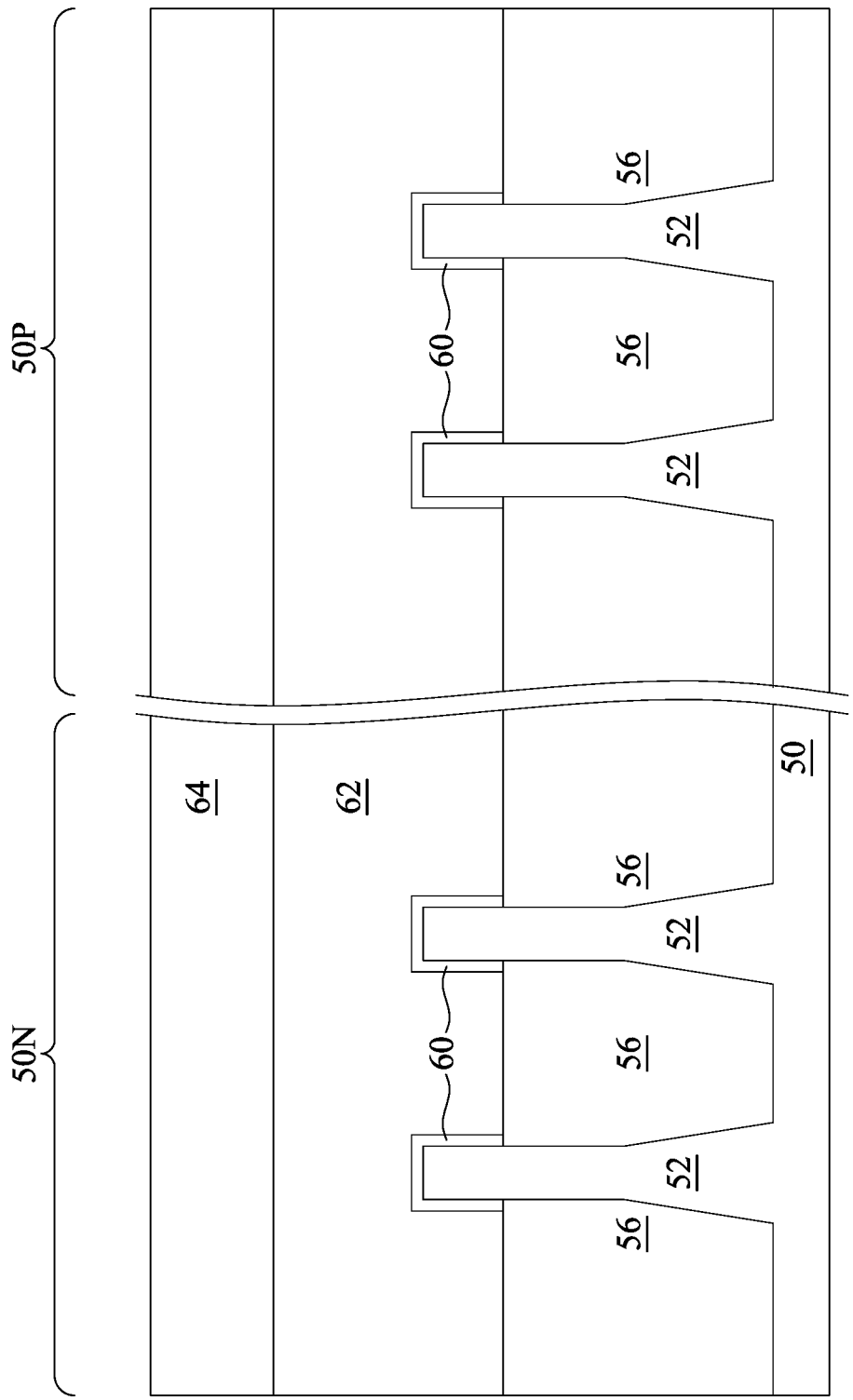

In FIG. 7, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive or non-conductive material and may be selected from a group including amorphous silicon, polycrystalline-silicon (polysilicon), polycrystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques for depositing the selected material. The dummy gate layer 62 may be made of other materials that have a high etching selectivity from the etching of isolation regions, e.g., the STI regions 56 and/or the dummy dielectric layer 60. The mask layer 64 may include one or more layers of, for example, silicon nitride, silicon oxynitride, or the like. In this example, a single dummy gate layer 62 and a single mask layer 64 are formed across the n-type region 50N and the p-type region 50P. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending over the STI regions and between the dummy gate layer 62 and the STI regions 56.

FIGS. 8A through 16 illustrate various additional steps in the manufacturing of embodiment devices. FIGS. 8A through 16 illustrate features in either of the n-type region 50N and the p-type region 50P. For example, the structures illustrated in FIGS. 8A through 16 may be applicable to both the n-type region 50N and the p-type region 50P. Differences (if any) in the structures of the n-type region 50N and the p-type region 50P are described in the text accompanying each figure.

Figure 8B:
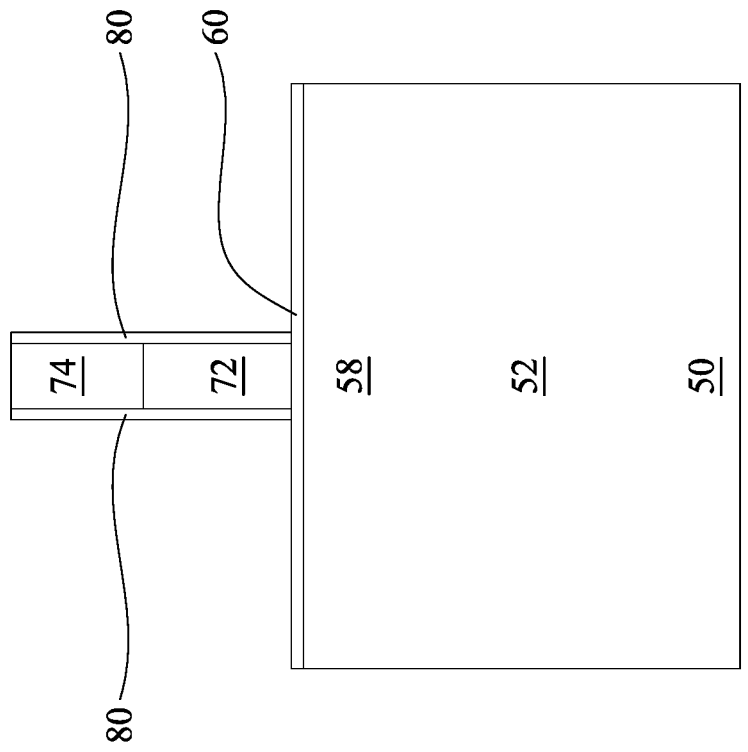
Figure 8A:
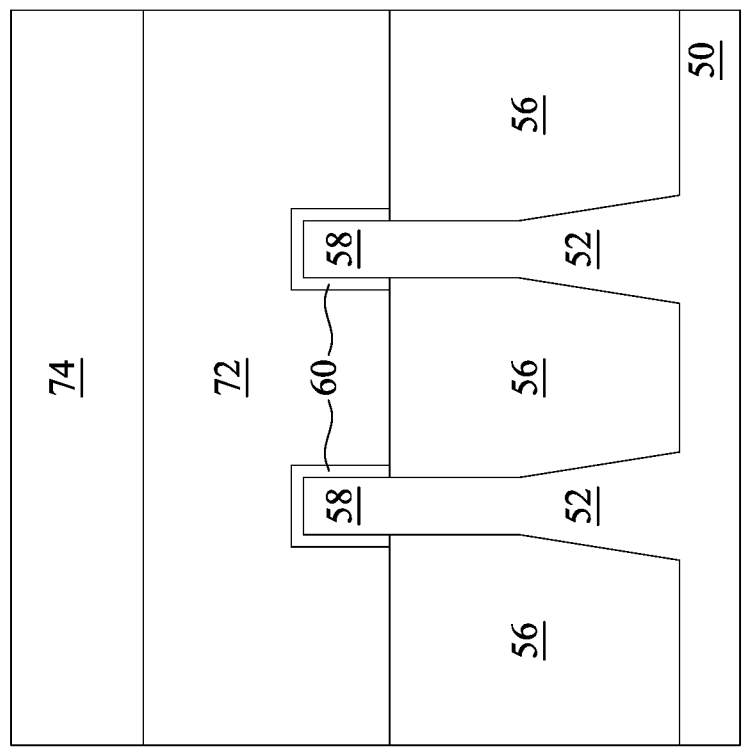

In FIGS. 8A and 8B, the mask layer 64 (see FIG. 7) may be patterned using acceptable photolithography and etching techniques to form masks 74. The pattern of the masks 74 then may be transferred to the dummy gate layer 62. In some embodiments (not illustrated), the pattern of the masks 74 may also be transferred to the dummy dielectric layer 60 by an acceptable etching technique to form dummy gates 72. The dummy gates 72 cover respective channel regions 58 of the fins 52. The pattern of the masks 74 may be used to physically separate each of the dummy gates 72 from adjacent dummy gates. The dummy gates 72 may also have a lengthwise direction substantially perpendicular to the lengthwise direction of respective epitaxial fins 52.

Further in FIGS. 8A and 8B, gate seal spacers 80 can be formed on exposed surfaces of the dummy gates 72, the masks 74, and/or the fins 52. A thermal oxidation or a deposition followed by an anisotropic etch may form the gate seal spacers 80. The gate seal spacers 80 may be formed of silicon oxide, silicon nitride, silicon oxynitride, or the like.

After the formation of the gate seal spacers 80, implants for lightly doped source/drain (LDD) regions (not explicitly illustrated) may be performed. In the embodiments with different device types, similar to the implants discussed above in FIG. 6, a mask, such as a photoresist, may be formed over the n-type region 50N, while exposing the p-type region 50P, and appropriate type (e.g., p-type) impurities may be implanted into the exposed fins 52 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 52 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{19}$ cm$^{-3}$. An anneal may be used to repair implant damage and to activate the implanted impurities.

Figure 9B:
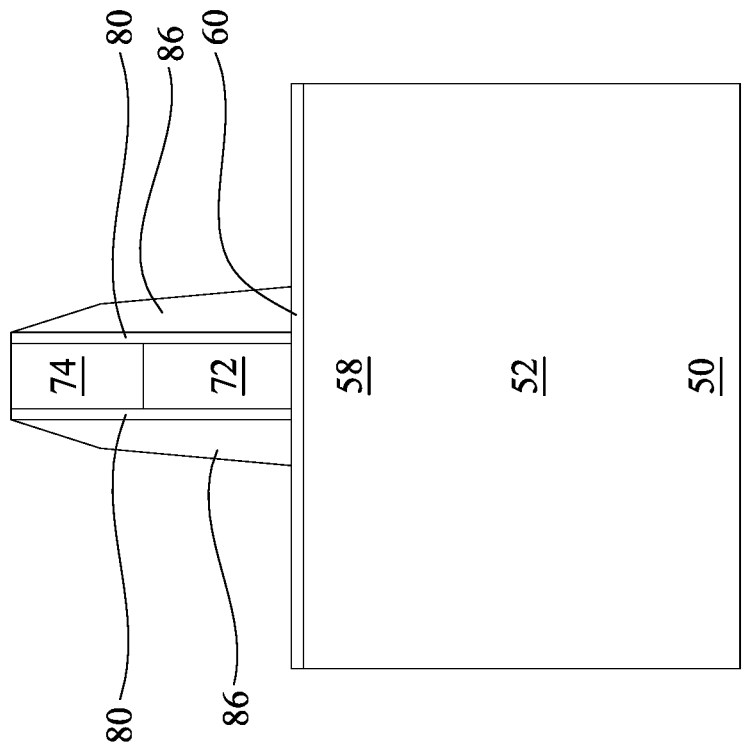
Figure 9A:
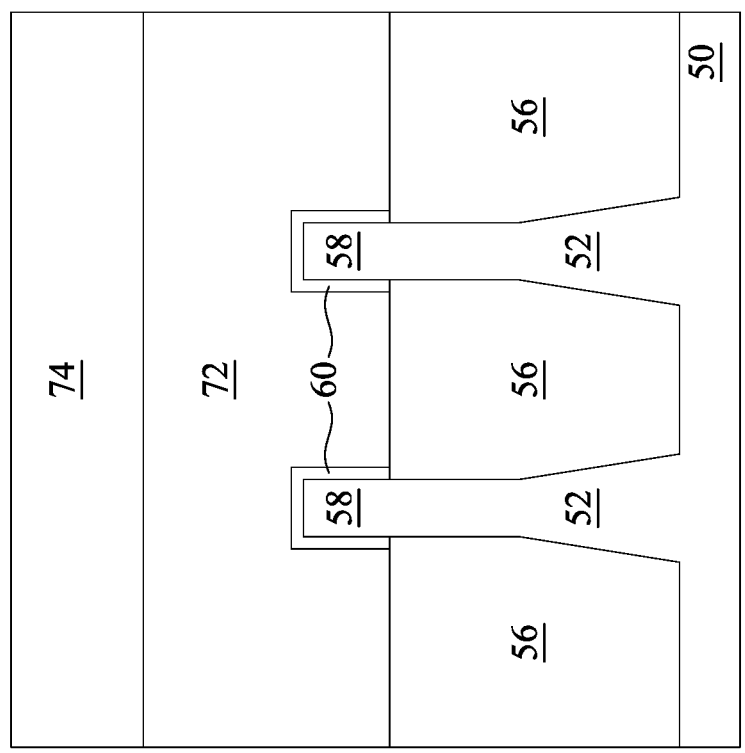

In FIGS. 9A and 9B, gate spacers 86 are formed on the gate seal spacers 80 along sidewalls of the dummy gates 72 and the masks 74. The gate spacers 86 may be formed by conformally depositing an insulating material and subsequently anisotropically etching the insulating material. The insulating material of the gate spacers 86 may be silicon oxide, silicon nitride, silicon oxynitride, silicon carbonitride, a combination thereof, or the like.

It is noted that the above disclosure generally describes a process of forming spacers and LDD regions. Other processes and sequences may be used. For example, fewer or additional spacers may be utilized, different sequence of steps may be utilized (e.g., the gate seal spacers 80 may not be etched prior to forming the gate spacers 86, yielding "L-shaped" gate seal spacers), spacers may be formed and removed, and/or the like. Furthermore, the n-type and p-type devices may be formed using a different structures and steps. For example, LDD regions for n-type devices may be formed prior to forming the gate seal spacers 80 while the LDD regions for p-type devices may be formed after forming the gate seal spacers 80.

Figure 10A:
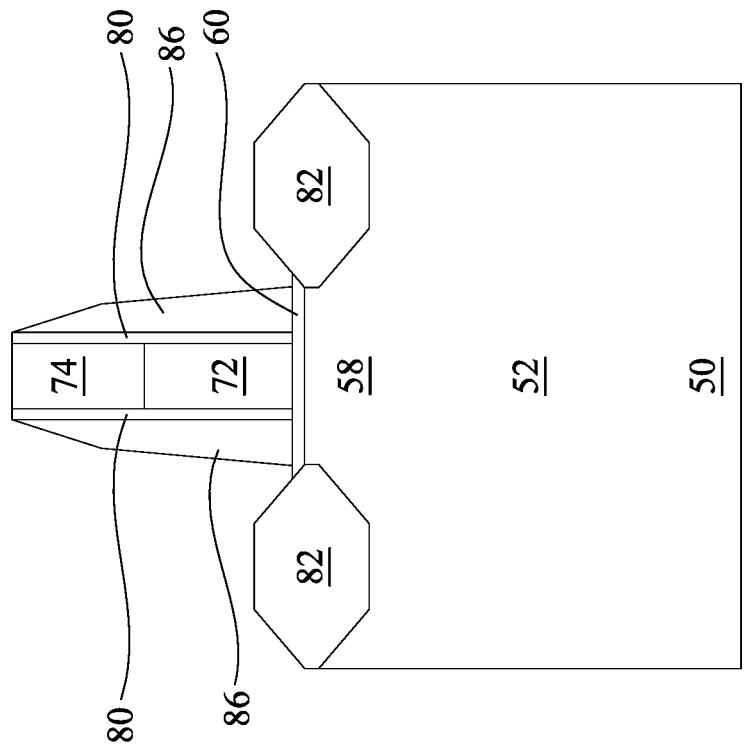
Figure 10B:
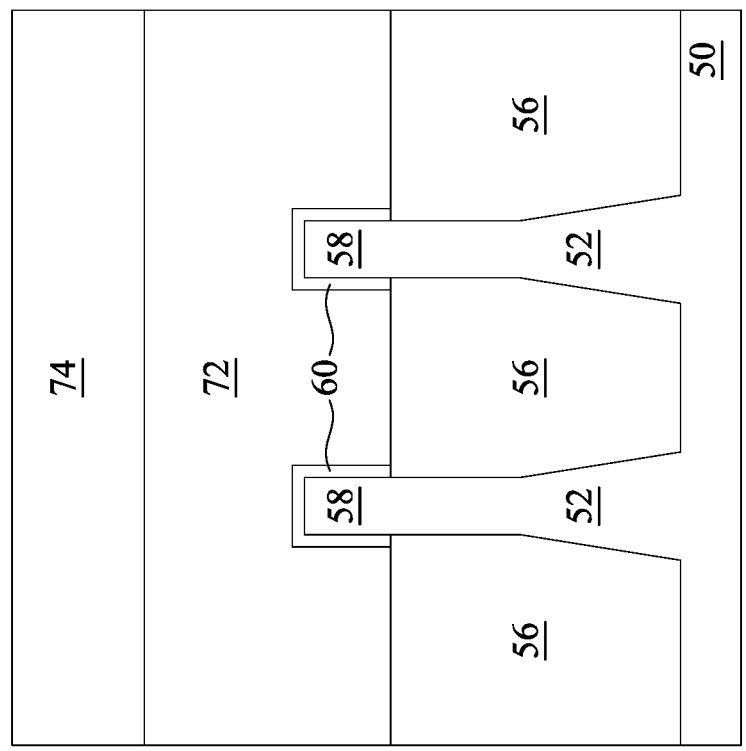
Figure 10C:
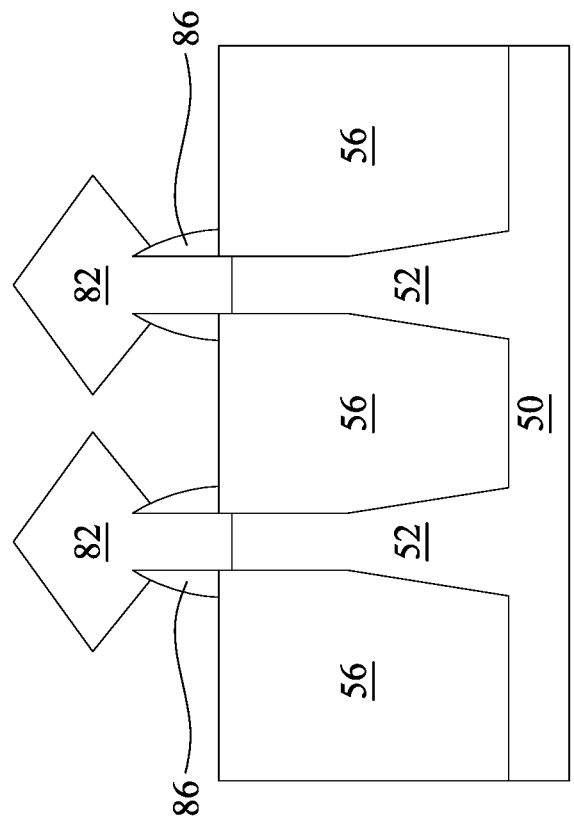
Figure 10D:
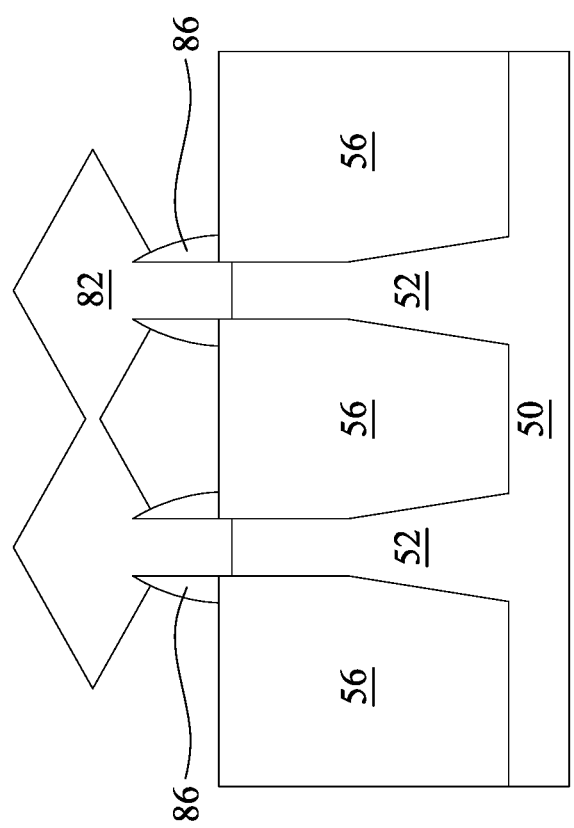

In FIGS. 10A and 10B epitaxial source/drain regions 82 are formed in the fins 52. The epitaxial source/drain regions 82 are formed in the fins 52 such that each dummy gate 72 is disposed between respective neighboring pairs of the epitaxial source/drain regions 82. In some embodiments the epitaxial source/drain regions 82 may extend into, and may also penetrate through, the fins 52. In some embodiments, the gate spacers 86 are used to separate the epitaxial source/drain regions 82 from the dummy gates 72 by an appropriate lateral distance so that the epitaxial source/drain regions 82 do not short out subsequently formed gates of the resulting FinFETs. A material of the epitaxial source/drain regions 82 may be selected to exert stress in the respective channel regions 58, thereby improving performance.

The epitaxial source/drain regions 82 in the n-type region 50N may be formed by masking the p-type region 50P and etching source/drain regions of the fins 52 in the n-type region 50N to form recesses in the fins 52. Then, the epitaxial source/drain regions 82 in the n-type region 50N are epitaxially grown in the recesses. The epitaxial source/drain regions 82 may include any acceptable material, such as appropriate for n-type FinFETs. For example, if the fin 52 is silicon, the epitaxial source/drain regions 82 in the n-type region 50N may include materials exerting a tensile strain in the channel region 58, such as silicon, silicon carbide, phosphorous doped silicon carbide, silicon phosphide, or the like. The epitaxial source/drain regions 82 in the n-type region 50N may have surfaces raised from respective surfaces of the fins 52 and may have facets.

The epitaxial source/drain regions 82 in the p-type region 50P may be formed by masking the n-type region 50N and etching source/drain regions of the fins 52 in the p-type region 50P to form recesses in the fins 52. Then, the epitaxial source/drain regions 82 in the p-type region 50P are epitaxially grown in the recesses. The epitaxial source/drain regions 82 may include any acceptable material, such as appropriate for p-type FinFETs. For example, if the fin 52 is silicon, the epitaxial source/drain regions 82 in the p-type region 50P may comprise materials exerting a compressive strain in the channel region 58, such as silicon-germanium, boron doped silicon-germanium, germanium, germanium tin, or the like. The epitaxial source/drain regions 82 in the p-type region 50P may have surfaces raised from respective surfaces of the fins 52 and may have facets.

The epitaxial source/drain regions 82 and/or the fins 52 may be implanted with dopants to form source/drain regions, similar to the process previously discussed for forming lightly-doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 82 may be in situ doped during growth.

As a result of the epitaxy processes used to form the epitaxial source/drain regions 82 in the n-type region 50N and the p-type region 50P, upper surfaces of the epitaxial source/drain regions have facets which expand laterally outward beyond sidewalls of the fins 52. In some embodiments, these facets cause adjacent source/drain regions 82 of a same FinFET to merge as illustrated by FIG. 10C. In other embodiments, adjacent source/drain regions 82 remain separated after the epitaxy process is completed as illustrated by FIG. 10D. In the embodiments illustrated in FIGS. 10C and 10D, gate spacers 86 are formed covering a portion of the sidewalls of the fins 52 that extend above the STI regions 56 thereby blocking the epitaxial growth. In some other embodiments, the spacer etch used to form the gate spacers 86 may be adjusted to remove the spacer material to allow the epitaxially grown region to extend to the surface of the STI region 56.

In FIGS. 11A and 11B, a first interlayer dielectric (ILD) 88 is deposited over the structure illustrated in FIGS. 10A and 10B. The first ILD 88 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 87 is disposed between the first ILD 88 and the epitaxial source/drain regions 82, the masks 74, and the gate spacers 86. The CESL 87 may comprise a dielectric material, such as, silicon nitride, silicon oxide, silicon oxynitride, or the like, having a lower etch rate than the material of the overlying first ILD 88.

Figure 12B:
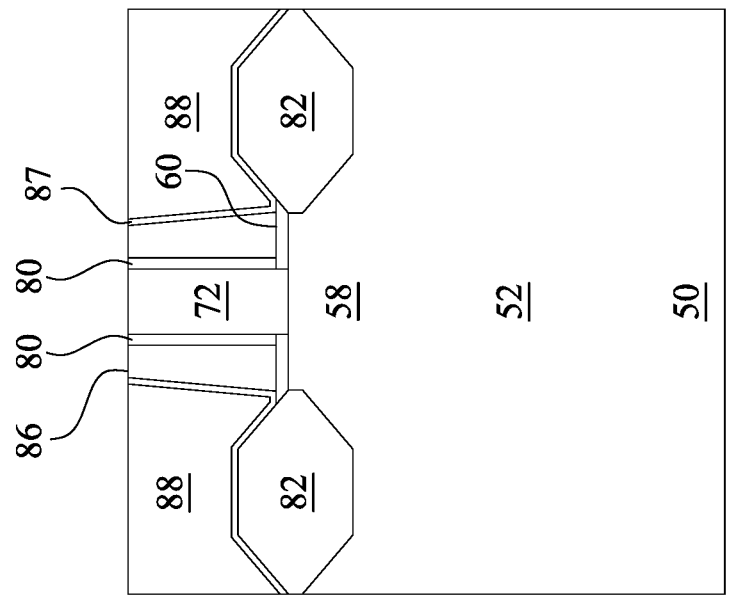
Figure 12A:
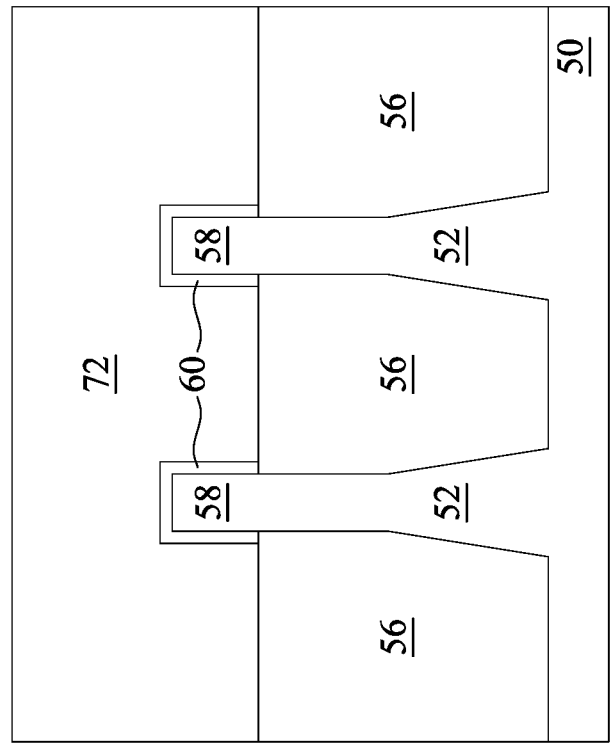

In FIGS. 12A and 12B, a planarization process, such as a CMP, may be performed to level the top surface of the first ILD 88 with the top surfaces of the dummy gates 72 or the masks 74. The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the first ILD 88 are level. Accordingly, the top surfaces of the dummy gates 72 are exposed through the first ILD 88. In some embodiments, the masks 74 may remain, in which case the planarization process levels the top surface of the first ILD 88 with the top surfaces of the masks 74.

Figure 13B:
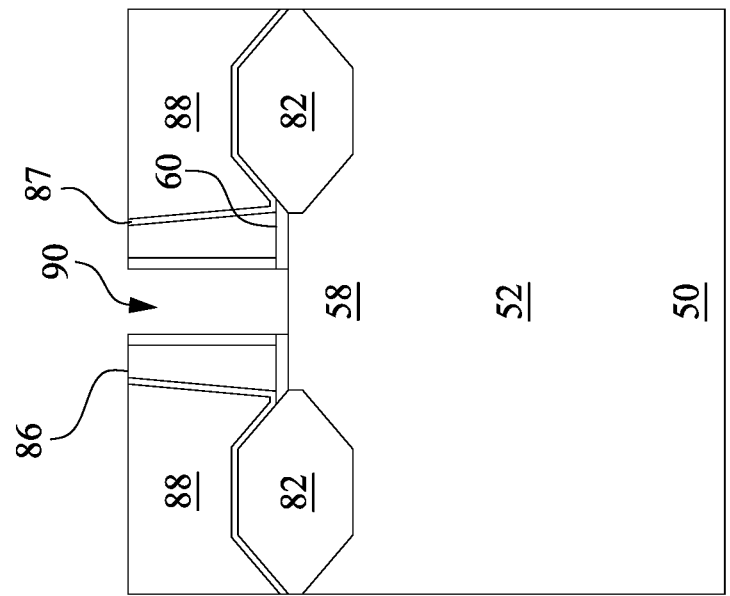
Figure 13A:
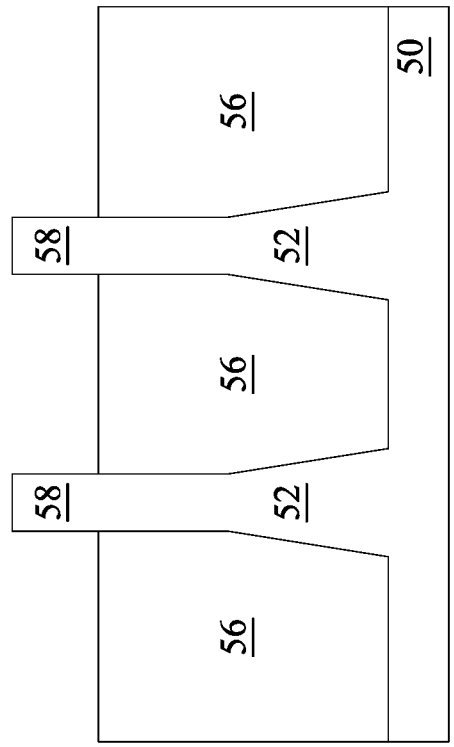

In FIGS. 13A and 13B, the dummy gates 72, and the masks 74 if present, are removed in an etching step(s), so that recesses 90 are formed. Portions of the dummy dielectric layer 60 in the recesses 90 may also be removed. In some embodiments, only the dummy gates 72 are removed and the dummy dielectric layer 60 remains and is exposed by the recesses 90. In some embodiments, the dummy dielectric layer 60 is removed from recesses 90 in a first region of a die (e.g., a core logic region) and remains in recesses 90 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 with little or no etching of the first ILD 88 or the gate spacers 86. Each recess 90 exposes and/or overlies a channel region 58 of a respective fin 52. Each channel region 58 is disposed between neighboring pairs of the epitaxial source/drain regions 82. During the removal, the dummy dielectric layer 60 may be used as an etch stop layer when the dummy gates 72 are etched. The dummy dielectric layer 60 may then be optionally removed after the removal of the dummy gates 72.

Figure 14B:
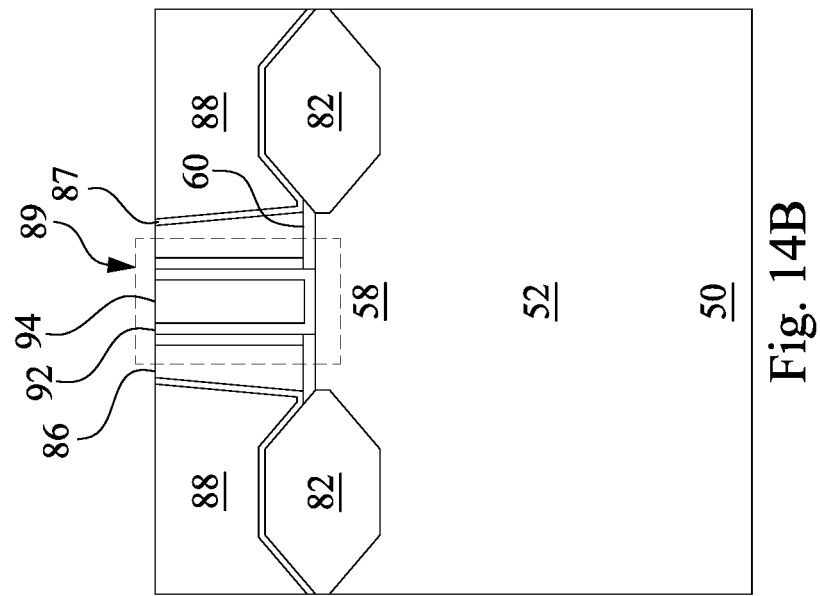
Figure 14A:
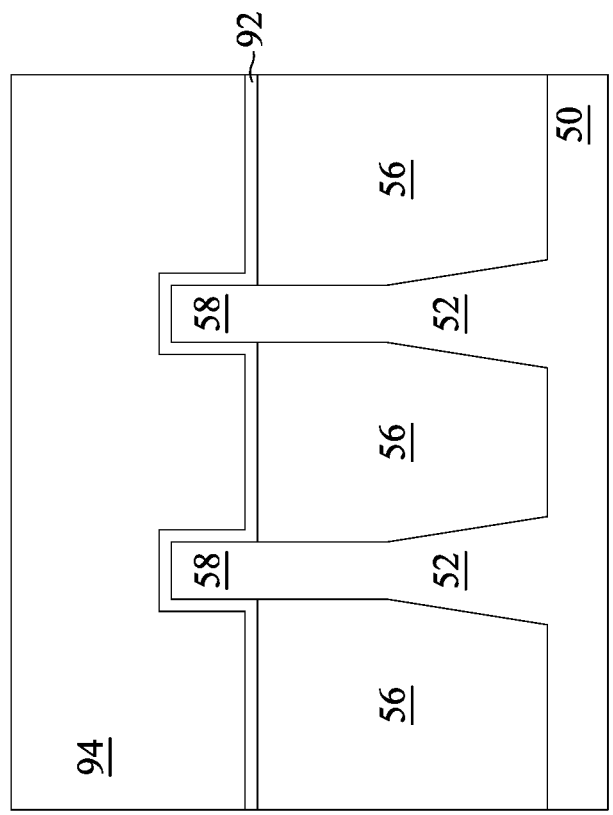

In FIGS. 14A and 14B, gate dielectric layers 92 and gate electrodes 94 are formed for replacement gates. FIG. 14C illustrates a detailed view of region 89 of FIG. 14B. Gate dielectric layers 92 are one or more layers deposited in the recesses 90, such as on the top surfaces and the sidewalls of the fins 52 and on sidewalls of the gate seal spacers 80/gate spacers 86. The gate dielectric layers 92 may also be formed on the top surface of the first ILD 88. In some embodiments, the gate dielectric layers 92 comprise one or more dielectric layers, such as one or more layers of silicon oxide, silicon nitride, metal oxide, metal silicate, or the like. For example, in some embodiments, the gate dielectric layers 92 include an interfacial layer of silicon oxide formed by thermal or chemical oxidation and an overlying high-k dielectric material, such as a metal oxide or a silicate of hafnium, aluminum, zirconium, lanthanum, manganese, barium, titanium, lead, and combinations thereof. The gate dielectric layers 92 may include a dielectric layer having a k value greater than about 7.0. The formation methods of the gate dielectric layers 92 may include Molecular-Beam Deposition (MBD), ALD, PECVD, and the like. In embodiments where portions of the dummy gate dielectric 60 remains in the recesses 90, the gate dielectric layers 92 include a material of the dummy gate dielectric 60 (e.g., $SiO_2$).

The gate electrodes 94 are deposited over the gate dielectric layers 92, respectively, and fill the remaining portions of the recesses 90. The gate electrodes 94 may include a metal-containing material such as titanium nitride, titanium oxide, tantalum nitride, tantalum carbide, cobalt, ruthenium, aluminum, tungsten, combinations thereof, or multi-layers thereof. For example, although a single layer gate electrode 94 is illustrated in FIG. 14B, the gate electrode 94 may comprise any number of liner layers 94A, any number of work function tuning layers 94B, and a fill material 94C as illustrated by FIG. 14C. After the filling of the recesses 90, a planarization process, such as a CMP, may be performed to remove the excess portions of the gate dielectric layers 92 and the material of the gate electrodes 94, which excess portions are over the top surface of the ILD 88. The remaining portions of material of the gate electrodes 94 and the gate dielectric layers 92 thus form replacement gates of the resulting FinFETs. The gate electrodes 94 and the gate dielectric layers 92 may be collectively referred to as a "gate stack." The gate and the gate stacks may extend along sidewalls of a channel region 58 of the fins 52.

The formation of the gate dielectric layers 92 in the n-type region 50N and the p-type region 50P may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, and/or the gate electrodes 94 in each region may be formed by distinct processes, such that the gate electrodes 94 may be different materials. Various masking steps may be used to mask and expose appropriate regions when using distinct processes.

Figure 15B:
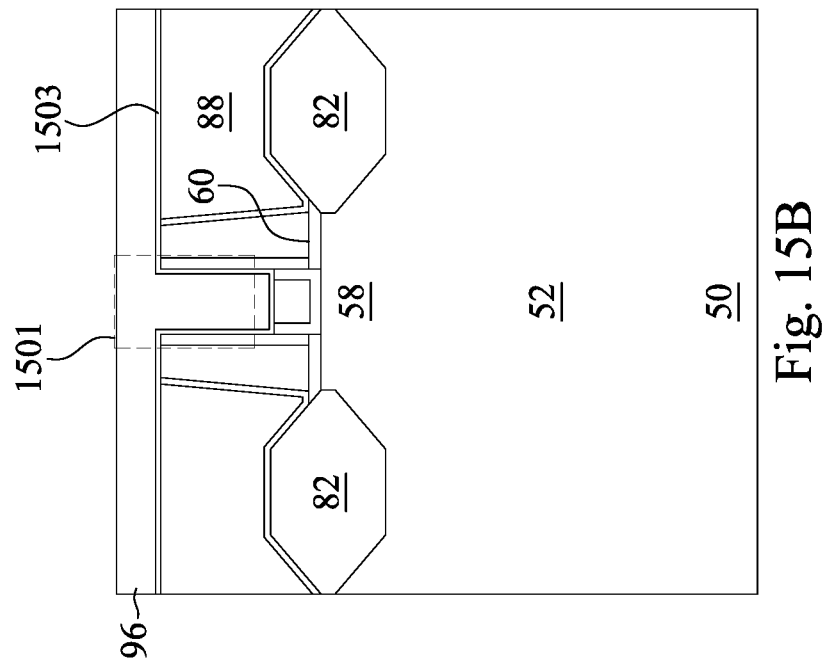
Figure 15A:
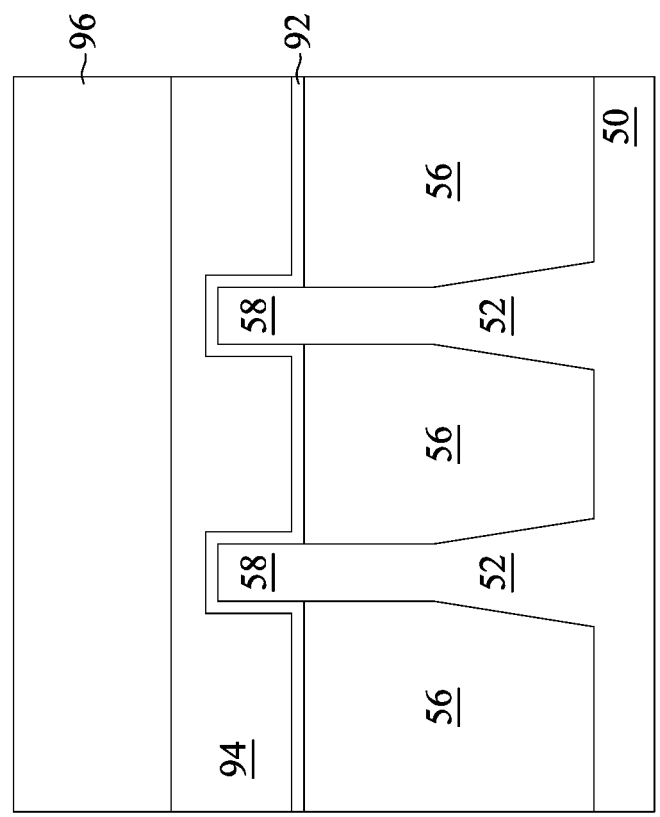

In FIGS. 15A, 15B, and 15C, an initiation of a method to form a first gate mask 1801 over the gate stack (including the gate dielectric layer 92 and the corresponding gate electrode 94) is illustrated, with FIG. 15C showing a close-up view of the dashed region 1501 in FIG. 15B. In some embodiments, forming the first gate mask 1801 includes initially recessing the gate stack so that a recess is formed directly over the gate stack and between opposing portions of the gate spacers 86. The recessing may be performed with one or more wet or dry etching processes that utilize etchants selective to the material of the gate electrodes 94 and the gate dielectric layers 92, to recess the materials to a first distance $D_1$ of between about 20 nm and about 60 nm. However, any suitable method may be utilized.

Once the materials have been recessed, a first liner 1503 and a first gate mask material 96 are then deposited in order to fill and/or overfill the recess formed. In an embodiment the first liner 1503 may be a dielectric material such as silicon carbonitride (SiCN), silicon oxycarbonitride (SiOCN), silicon nitride, combinations of these, or the like, that is deposited using a deposition method such as atomic layer deposition, chemical vapor deposition, physical vapor deposition, combinations of these, or the like. However, any suitable material and any suitable method of deposition may be utilized.

In an embodiment the first gate mask material 96 comprises one or more layers of dielectric material, such as silicon oxide, silicon nitride, silicon oxynitride, or the like, deposited using a method such as chemical vapor deposition, atomic layer deposition, physical vapor deposition, combinations of these, or the like. However, any suitable methods and materials may be utilized.

FIG. 16 illustrates that, once the first gate mask material 96 has been deposited, the first gate mask material 96 and the first liner 1503 are then planarized to remove excess portions of the first gate mask material 96 outside of the recess between the gate seal spacers 80. In an embodiment the first gate mask material 96 and the first liner 1503 may be planarized using a planarization process such as chemical mechanical polishing, grinding, etch back process, combinations of these, or the like, in order to remove excess portions of the first gate mask material 96 and the first liner 1503 extending over the gate seal spacers 80 and the first ILD 88. However, any suitable method may be utilized.

Figure 17:
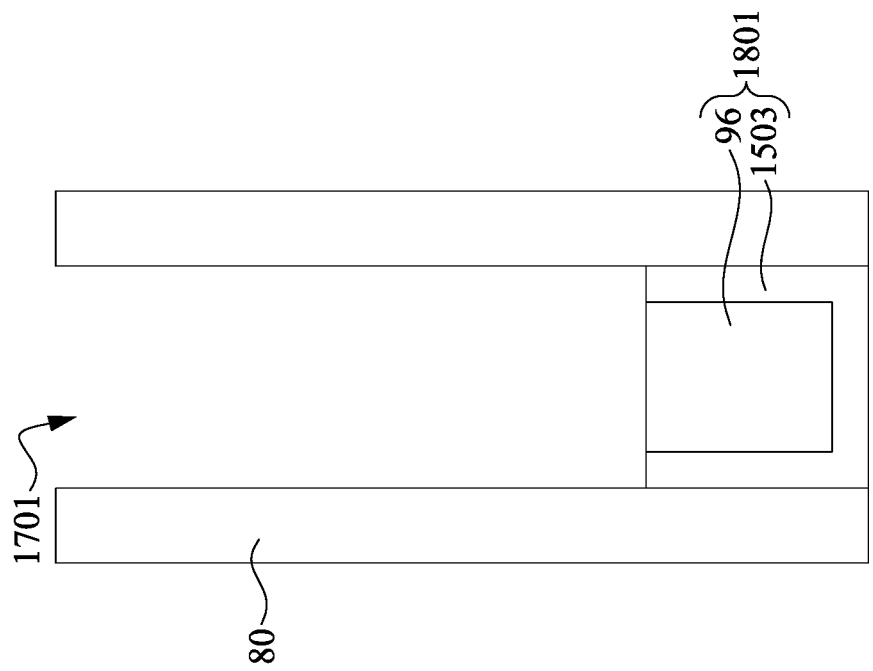

FIG. 17 illustrates a formation of a first trench 1701. In an embodiment the first trench 1701 may be formed using a wet or dry etching process with etchants that are selective to the first gate mask material 96 so that the first gate mask material 96 is removed selectively to the material of the first liner 1503, thereby forming the first trench 1701 within the first liner 1503. In a particular embodiment the first trench 1701 may be formed to have a second distance $D_2$ (below the first liner 1503) of between about 10 nm and about 50 nm. However, any suitable removal process and any suitable distance may be utilized.

Figure 18:
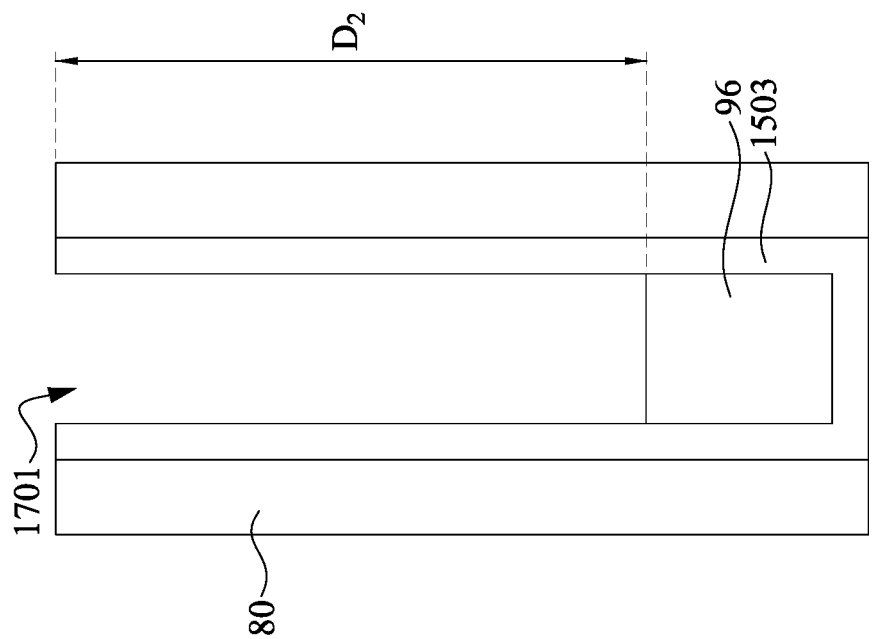

FIG. 18 illustrates an expansion of the first trench 1701 through a removal of the exposed portions of the first liner 1503 (e.g., those portions not covered by the first gate mask material 96 after the formation of the first trench 1701). In an embodiment the exposed portions of the first liner 1503 may be removed using one or more etching processes, such as a wet etch, that uses an etchant selective to the material of the first liner 1503. However, any suitable process may be utilized.

By forming the first gate mask material 96 and the first liner 1503 and then recessing the first gate mask material 96 and the first liner 1503, the first gate mask 1801 may be formed. In an embodiment the first gate mask 1801 (after the recessing) is recessed from the top of the gate seal spacers 80 by the second distance $D_2$. However, any suitable distance may be utilized.

Figure 19:
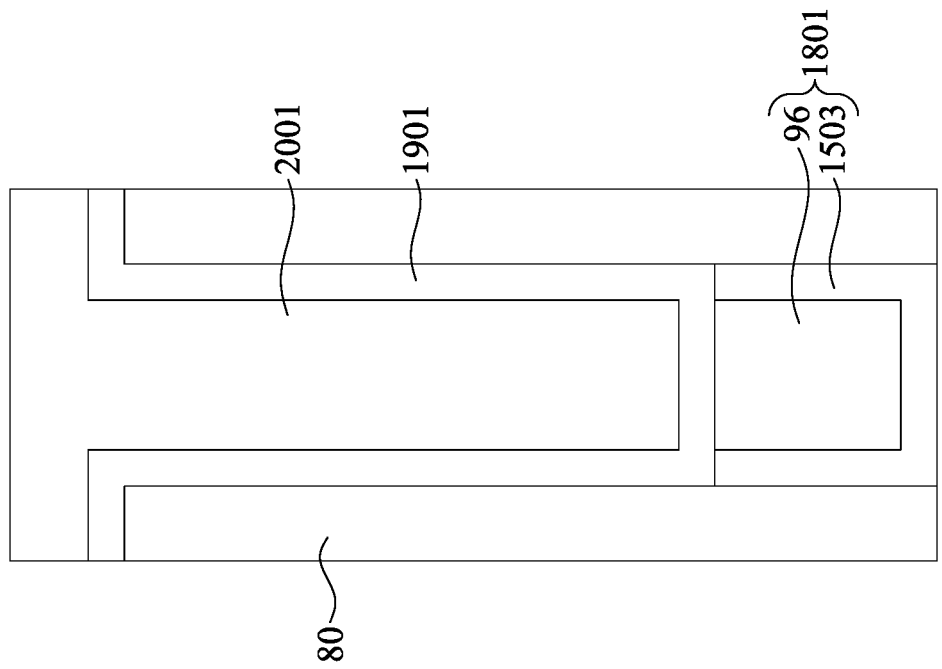

FIG. 19 illustrates deposition of a second liner 1901 within the first trench 1701. In an embodiment the second liner 1901 may be a dielectric material that provides an excellent resistance to subsequent etches, such as hafnium oxide ($HfO_2$), silicon carbon nitride (SiCN), silicon oxycarbonitride (SiCON), combinations of these, or the like. The material of the second liner 1901 may be deposited using a deposition process such as atomic layer deposition, chemical vapor deposition, physical vapor deposition, combinations of these, or the like, to a thickness of between about 2 nm and about 6 nm. However, any suitable material, thickness, and method of deposition may be utilized.

By depositing the second liner 1901 within the first trench 1701, the dimensions of the first trench 1701 are reduced. In a particular embodiment, after deposition of the second liner 1901, the first trench 1701 may have a depth at a third distance $D_3$ of between about 4 nm and about 48 nm, and a first width $W_1$ of between about 3 nm and about 500 nm. With such dimensions, the first trench 1701 will have a first aspect ratio of between about 16 and about 0.008. However, any suitable dimensions may be utilized.

Figure 20:
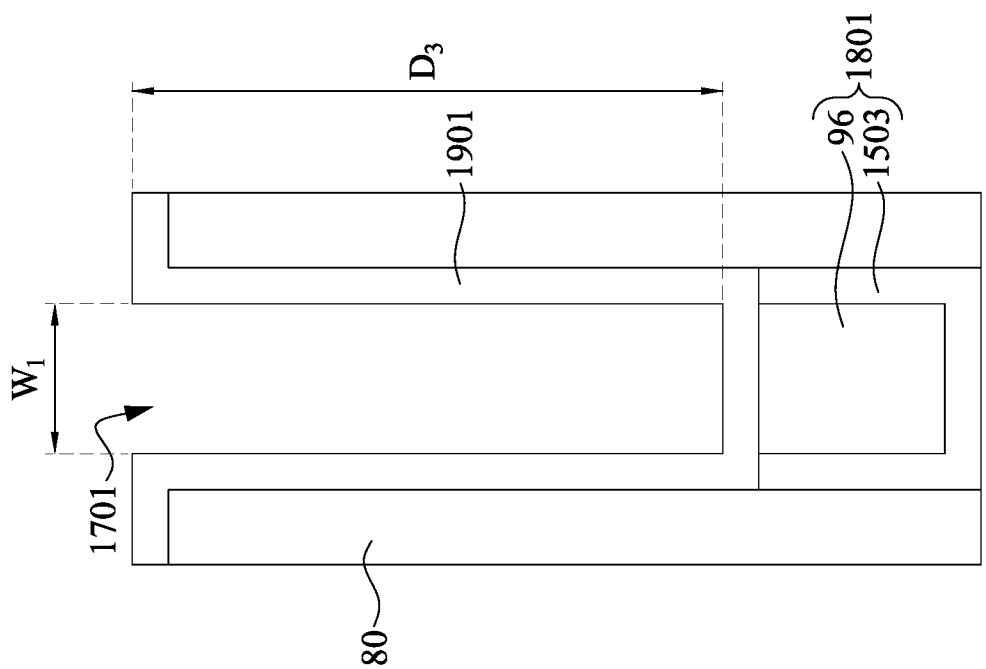

FIG. 20 illustrates that, once the second liner 1901 has been deposited, a second gate mask material 2001 may be deposited to fill and/or overfill the first trench 1701. In an embodiment the second gate mask material 2001 may be a dielectric material such as SiOC, SiCO, SiOCN, combinations of these, or the like. Additionally, the second gate mask material 2001 may be deposited using a deposition process that has an excellent gap-fill capability, such as flowable CVD, a spin-on process, combinations of these, or the like.

FIG. 21 illustrates that, once the second gate mask material 2001 has been deposited, the second gate mask material 2001 is then planarized to remove excess portions of the second gate mask material 2001. However, in this planarization step, the second gate mask material 2001 is planarized to be coplanar with the second liner 1901 (not the gate seal spacers 80). In an embodiment the second gate mask material 2001 may be planarized using a planarization process such as chemical mechanical polishing, grinding, etch back process, combinations of these, or the like, in order to remove excess portions of the second gate mask material 2001 extending over the second liner 1901. However, any suitable method may be utilized.

FIG. 22 illustrates removal of a portion of the second gate mask material 2001 in order to form a second trench 2201. In an embodiment the second gate mask material 2001 may be recessed using one or more etching processes, such as a reactive ion etch process, a wet etch process, combinations of these, or the like, wherein the one or more etching processes utilize etchants that are selective to the second gate mask material 2001. However, any suitable process may be utilized.

In an embodiment the second trench 2201 may be formed to a third distance $D_3$ of between about 5 nm and about 30 nm. If the third distance $D_3$ is larger than about 30 nm, a void would occur during subsequent manufacturing processes such as annealing. Further, if the third distance $D_3$ is smaller than 5 nm, the underlying second gate mask material 2001 could be damaged since a third liner 2301 is not thick enough to protect it.

FIG. 23 illustrates a deposition of a third liner 2301 in order to fill and/or overfill the second trench 2201. In an embodiment the third liner 2301 may be the same material as the second liner 1901 (e.g., $HfO_2$) deposited using a similar method of deposition (e.g., atomic layer deposition), although any suitable material and method of manufacture may be utilized. As such, in some embodiments there may not be a clear distinguishing boundary between the third liner 2301 and the second liner 1901, which is illustrated in FIG. 23 and subsequent figures by the dashed line.

FIG. 24 illustrates that, once the third liner 2301 has been deposited, the third liner 2301 and the second liner 1901 are then planarized to remove excess portions of the third liner 2301 and the second liner 1901 and to make the third liner 2301 and the second liner 1901 coplanar with the gate seal spacers 80. In an embodiment the third liner 2301 and the second liner 1901 may be planarized using a planarization process such as chemical mechanical polishing, grinding, etch back process, combinations of these, or the like, in order to remove excess portions of the third liner 2301 and the second liner 1901 extending over the gate seal spacers 80. However, any suitable method may be utilized.

Figure 25:
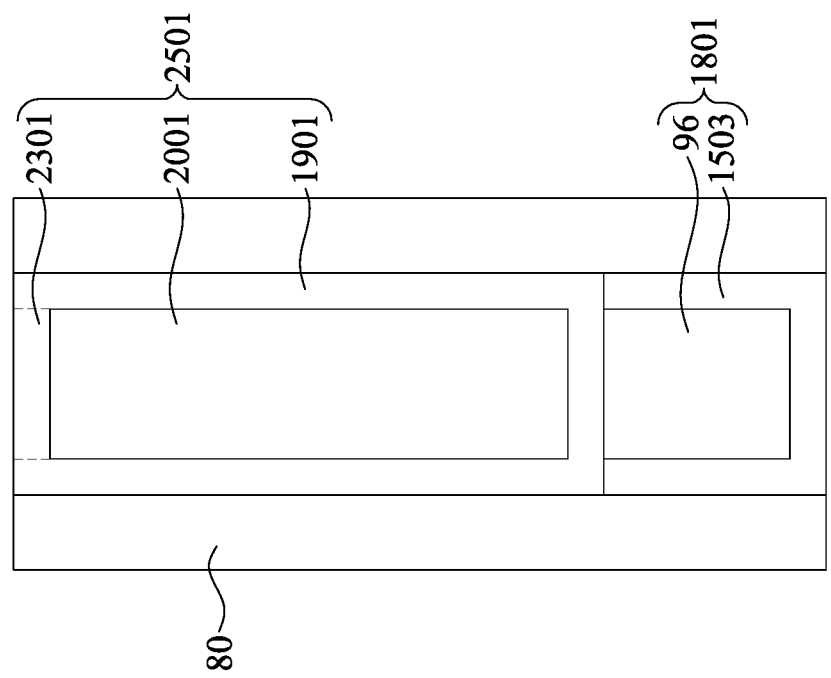

FIG. 25 illustrates that, once the third liner 2301 and the second liner 1901 have been planarized, the material of the third liner 2301 and the second liner 1901 may be crystallized in order to enhance its resistance to etching processes, while simultaneously densifying the material of the second gate mask material 2001. In an embodiment the material of the third liner 2301 and the second liner 1901 may be crystallized using an annealing process, whereby the material of the second liner 1901 is annealed at a temperature of between about 700° C. and about 900° C. for a time of between about 30 seconds and about 3 minutes. However, any suitable method of crystallizing the third liner 2301 and the second gate mask material 2001 may be utilized.

By crystallizing the second liner 1901 and the third liner 2301 a first capping layer 2501 is formed. This first capping layer 2501 comprises a crystallized-core/shell gap fill hard mask which can be utilized to help protect underlying structures. Additionally, using the manufacturing process presented, the crystallized-core/shell gap fill hard mask may be formed without seams or voids which may reduce the effectiveness of the hard mask. As such, a better isolation with fewer defects can be obtained.

Figure 26:
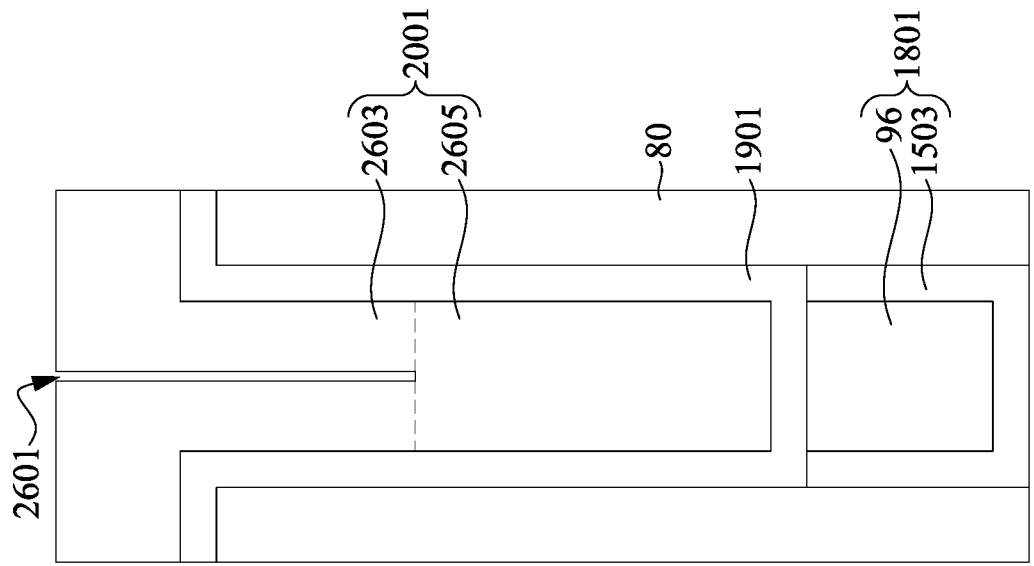

FIG. 26 illustrates the start of another embodiment in which the first capping layer 2501 (e.g., the crystallized-core, shell gap fill hard mask) can be manufactured without voids or seams. In this embodiment, however, instead of using an enhanced gap-fill method (e.g., flowable CVD or a spin-on process, as described above with respect to FIG. 20), the material of the second gate mask material 2001 is deposited using a deposition process such as atomic layer deposition, chemical vapor deposition, physical vapor deposition, combinations of these, or the like. However, because the first trench 1701 is formed with the first width $W_1$ and the third distance $D_3$ (and, hence, the first aspect ratio) as described above, by using one of these processes (instead of the enhanced gap-fill methods described above), as the second gate mask material 2001 is grown from each sidewall, part of the second gate mask material 2001 will merge along a bottom of the first trench 1701 without merging along a top of the first trench 1701. As such, a first void 2601 or seam may form in a first portion 2603 of the second gate mask material 2001, while the first void 2601 or seam may not be present in a second portion 2605 of the second gate mask material 2001 (e.g., wherein the material growing from the sidewalls does merge). For convenience and clarity, the first portion 2603 and the second portion 2605 of the second gate mask material 2001 are illustrated as being separated from each other by a dashed line in FIG. 26, although a physical indication of the separation may or may not be present.

Figure 27:
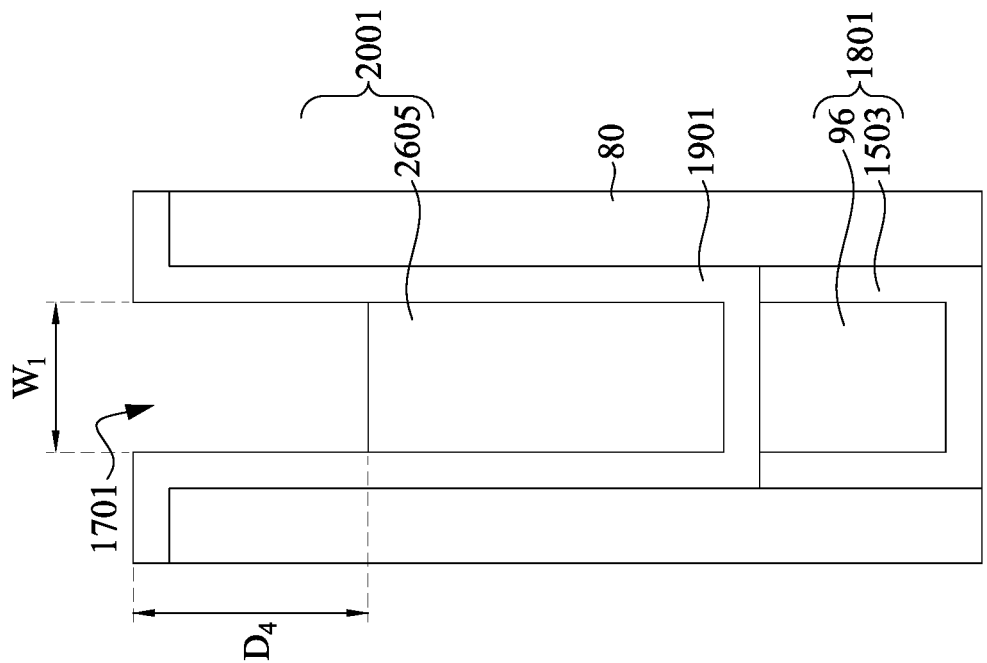

FIG. 27 illustrates that, in such an embodiment in which the first void 2601 is formed in the upper first portion 2603 of the second gate mask material 2001, the second gate mask material 2001 is recessed by removing at least the material of the first portion 2603. As such, by removing the first portion 2603 of the second gate mask material 2001 with the first void 2601 present, the first void 2601 will also be removed along with the first portion 2603 of the second gate mask material 2001.

In an embodiment the recessing of the material of the first portion 2603 of the second gate mask material 2001 may be performed using a first etching process, such as a dry etch process or a wet etch process. For example, in an embodiment in which a dry etch process is utilized, an etching process such as a reactive ion etch with etchants selective to the material of the second gate mask material 2001, such as a fluorine/chlorine based gas along with any desired carrier gases or diluent gases, such as nitrogen and/or hydrogen is utilized. Additionally, the second gate mask material 2001 may be recessed to a point below the first void 2601, such as a fourth distance $D_4$ of between about 2 nm and about 40 nm while returning the first trench 1701 to the first width $W_1$. As such, after the recessing of the first portion 2603 of the second gate mask material 2001 the first trench 1701 may have a second aspect ratio that is less than the first aspect ratio, such as the second aspect ratio being between about 13.3 and about 0.004. However, any suitable method may be utilized to recess the material of the first portion 2603 of the second gate mask material 2001 and remove the first void 2601 and any suitable distance may be utilized.

Optionally, if desired, after the first etching process is performed to remove the first portion 2603 of the second gate mask material 2001 and the first void 2601, a wet clean may be performed in order to remove any undesirable by-products that may have resulted from the first etching process. In an embodiment the wet clean may be performed with a wet etching process that utilizes etchants selective to the by-products, such as diluted hydrogen fluoride, phosphoric acid ($H_3PO_4$), sulfuric acid ($H_2SO_4$), combinations of these, or the like. However, any suitable cleaning process may be utilized.

Figure 28:
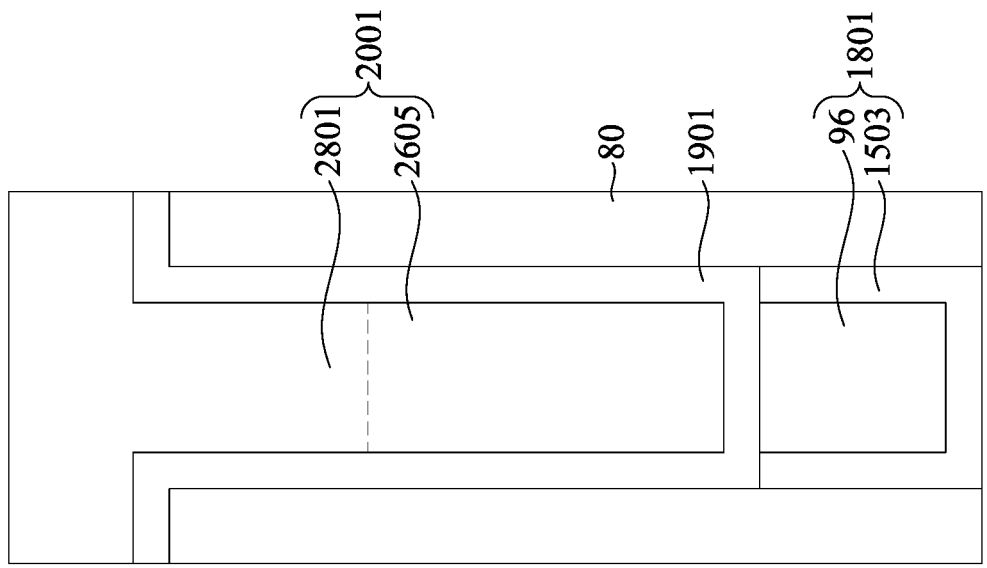

FIG. 28 illustrates that, once the first void 2601 has been removed, a third portion 2801 of the second gate mask material 2001 is deposited in order to fill and/or overfill the first trench 1701 over the second portion 2605 of the second gate mask material 2001. In an embodiment the third portion 2801 of the second gate mask material 2001 may be deposited using materials and methods similar to the first portion 2603 of the second gate mask material 2001 and the second portion 2605 of the second gate mask material 2001 described above with respect to FIG. 26. However, any suitable methods and materials may be utilized.

Additionally, by forming the first portion 2603 with the first void 2601 and then removing the first void 2601, the overall aspect ratio of the first trench 1701 is reduced from the first aspect ratio to the second aspect ratio. With this reduced second aspect ratio the deposition of the third portion 2801 of the second gate mask material 2001 can be performed without the formation of any voids (e.g., the first void 2601) in the third portion 2801 of the second gate mask material 2001. As such, the overall second gate mask material 2001 (e.g. the second portion 2605 and the third portion 2801) will be formed without voids.

Once the second gate mask material 2001 has been formed without the voids, the remainder of the manufacturing steps as described above with respect to FIGS. 21-25 may be performed to manufacture the capping layer 2501. For example, the second gate mask material 2001 may be recessed, the third liner 2301 may be deposited into the recess, the third liner 2301 and the second liner 1901 may be planarized, and the third liner 2301 and the second liner 1901 may be crystallized as described above with respect to FIGS. 21-25. However, any suitable methods may be utilized.

By utilizing multiple deposition processes along with a removal of the first void 2601, the second gate mask material 2001 can again be formed without the presence of voids or other defects. However, in this embodiment the goal of avoiding voids can be achieved without the usage of specialized deposition processes. As such, a wider array of deposition processes can be utilized to obtain the desired reduction in voids and defects.

Figure 30:
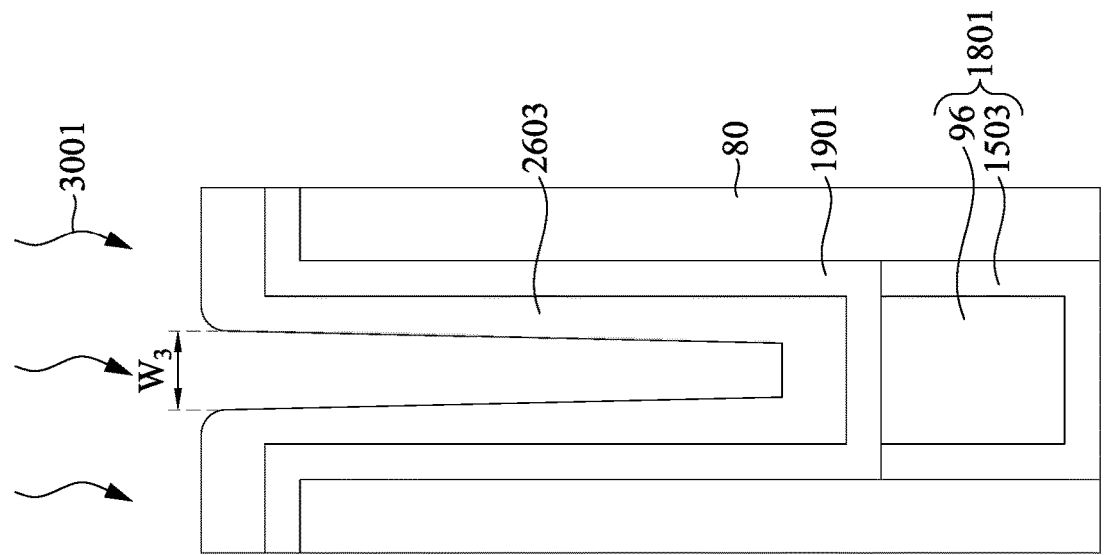
Figure 29:
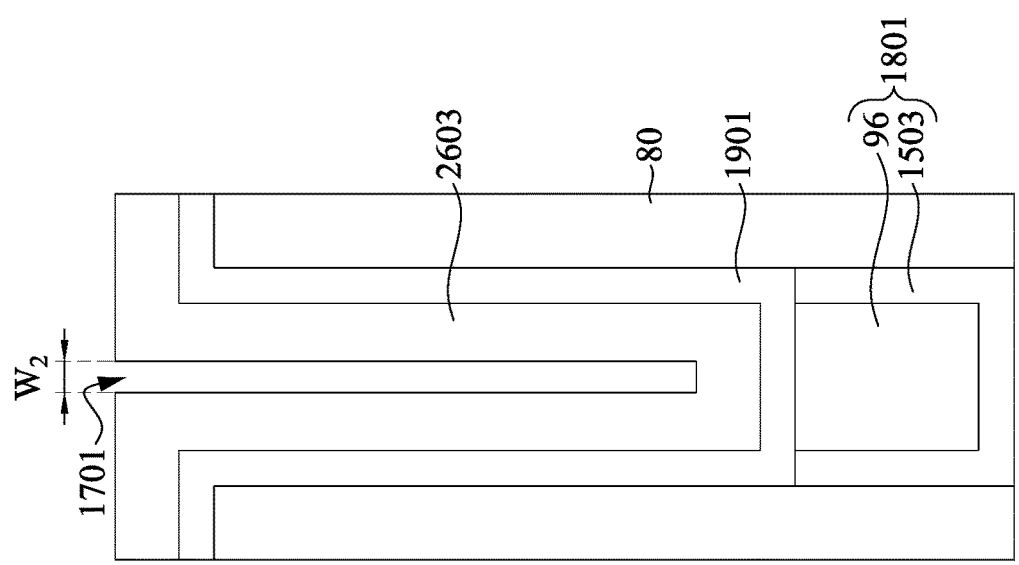
Figure 31:
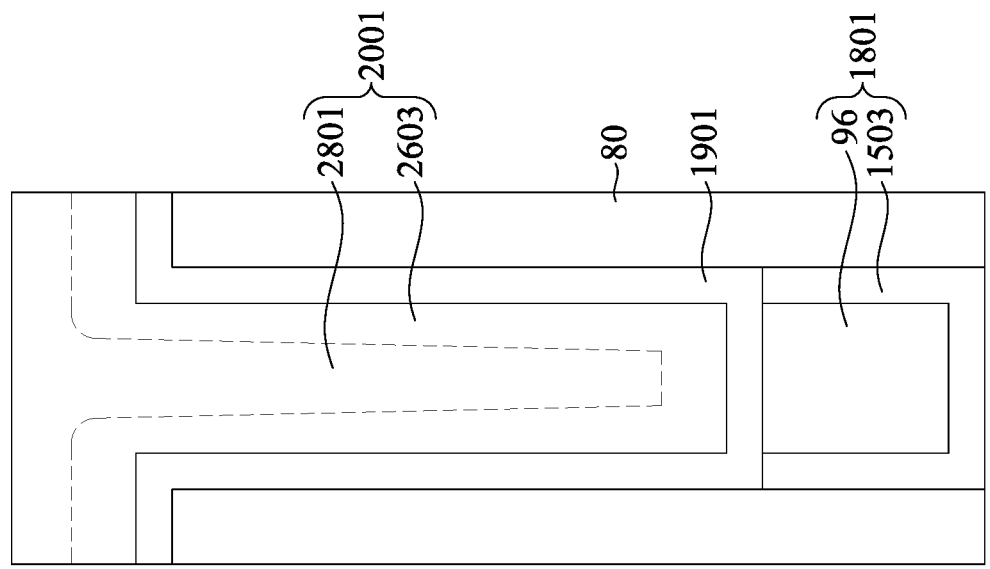

FIGS. 29-31 illustrate another embodiment in which the second gate mask material 2001 is formed without voids using the deposition of the first portion 2603 and the third portion 2801. In this embodiment, however, the first portion 2603 is deposited in a conformal manner such that the deposited material does not merge within the first trench 1701. As such, the second portion 2605 of the second gate mask material 2001 is not formed as described above with respect to FIG. 26.

Looking first at FIG. 29, in this embodiment the first portion 2603 of the second gate mask material 2001 is deposited using a conformal deposition process, such as an atomic layer deposition process. Additionally, the first portion 2603 of the second gate mask material 2001 is deposited to a thickness that is insufficient for the material of the first portion 2603 to merge along a bottom of the first trench 1701, such as a thickness of between about 1 nm and about 8 nm. As such, at this point in the manufacturing process, the first trench 1701 has a top opening that has a second width $W_2$ of between about 0.5 nm and about 500 nm. However, any suitable thickness and width may be utilized.

FIG. 30 illustrates that, once the first portion 2603 of the second gate mask material 2001 has been deposited conformally, a treatment process (represented in FIG. 30 by the wavy lines labeled 3001) is utilized to reshape the first portion 2603 of the second gate mask material 2001 before further deposition occurs. In an embodiment the treatment process 3001 may be a chemical treatment such as a plasma treatment utilizing first precursors that are utilized to densify portions of the second gate mask material 2001 and also utilize (either simultaneously or sequentially) second precursors that are utilized to etch portions of the second gate mask material 2001. In a particular embodiment the first precursors (e.g. the densifying precursors) may be precursors such as argon, nitrogen, helium, combinations of these, or the like, while the second precursors (e.g., the etching precursors) may be precursors such as $NF_3$, HF, ammonia (NH$_3$), H$_2$, O$_2$, combinations of these (e.g., NF$_3$+HF or NF$_3$+NH$_3$), or the like. However, any suitable precursors may be utilized.

By utilizing the treatment process 3001, the first portion 2603 of the second gate mask material 2001 will be reshaped to have a "V"-shaped profile. In particular, the profile occurs by causing the top corners of the first portion 2603 (e.g., those corners located outside of the gate seal spacers 80) to densify (from, e.g., exposure to the first precursors), and be removed at a first etch rate (from, e.g., exposure to the second precursors), while portions of the first portions 2603 located at a bottom of the first trench 1701 are densified and removed at a second etch rate less than the first etch rate (caused by the gas/plasma concentration distribution having a high concentration near the top corners and a low concentration within the first trench 1701). However, any suitable reshaping process may be utilized.

However, by utilizing the treatment process 3001 to reshape the top of the first trench 1701, the top of the first trench 1701 is wider after the treatment process 3001 than it was before the treatment process 3001. As such, the first trench 1701 may now have a top opening that has a third width W$_3$ of between about 3 nm and about 500 nm. Accordingly, the first trench 1701 with the third width W$_3$ has a more conducive shape to avoid the formation of voids during subsequent deposition processes.

FIG. 31 illustrates that, once the first portion 2603 has been reshaped, the third portion 2801 of the second gate mask material 2001 is deposited in order to fill and/or overfill the remainder of the first trench 1701. In an embodiment the third portion 2801 of the second gate mask material 2001 may be deposited using materials and methods similar to the first portion 2603 of the second gate mask material 2001 described above with respect to FIG. 26. However, any suitable methods and materials may be utilized.

Additionally, by reshaping the first portion 2603 of the second gate mask material 2001 prior to the deposition of the third portion 2801, the deposition of both the first portion 2603 and the third portion 2801 may form the second gate mask material 2001 while avoiding the creation of voids and/or seams. Without the voids or seams the second gate mask material 2001 can work with the first gate mask 1801 to better isolate the gate electrode 94 during subsequent manufacturing processes.

Once the second gate mask material 2001 has been formed without the voids, the remainder of the manufacturing steps may be performed as described above with respect to FIGS. 21-25 to manufacture the capping layer 2501. For example, the second gate mask material 2001 may be recessed, the third liner 2301 may be deposited into the recess, the third liner 2301 and the second liner 1901 may be planarized, and the third liner 2301 and the second liner 1901 may be crystallized as described above with respect to FIGS. 21-25.

Figure 32:
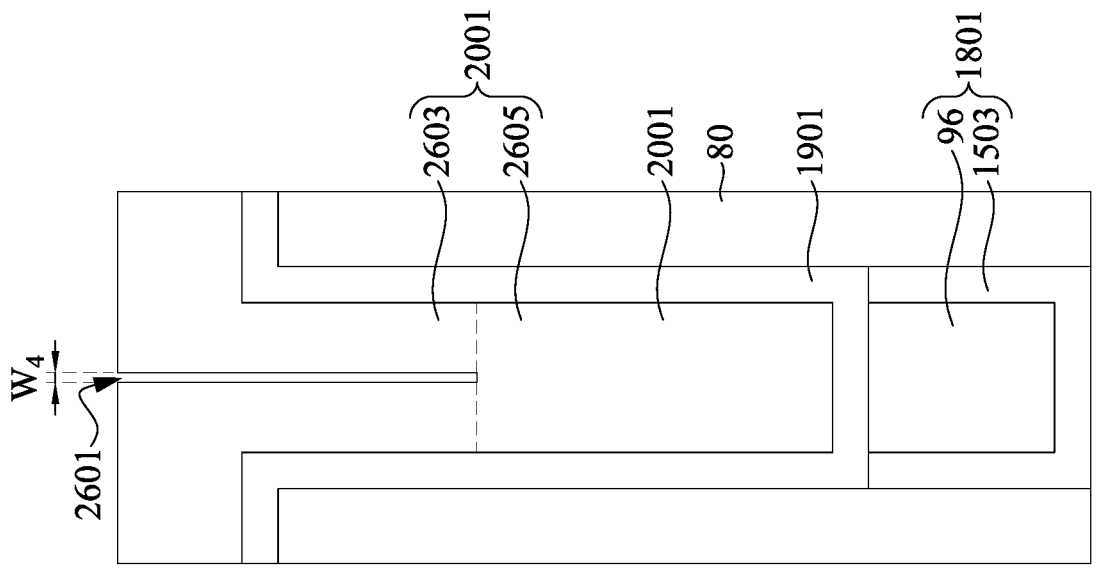
Figure 33:
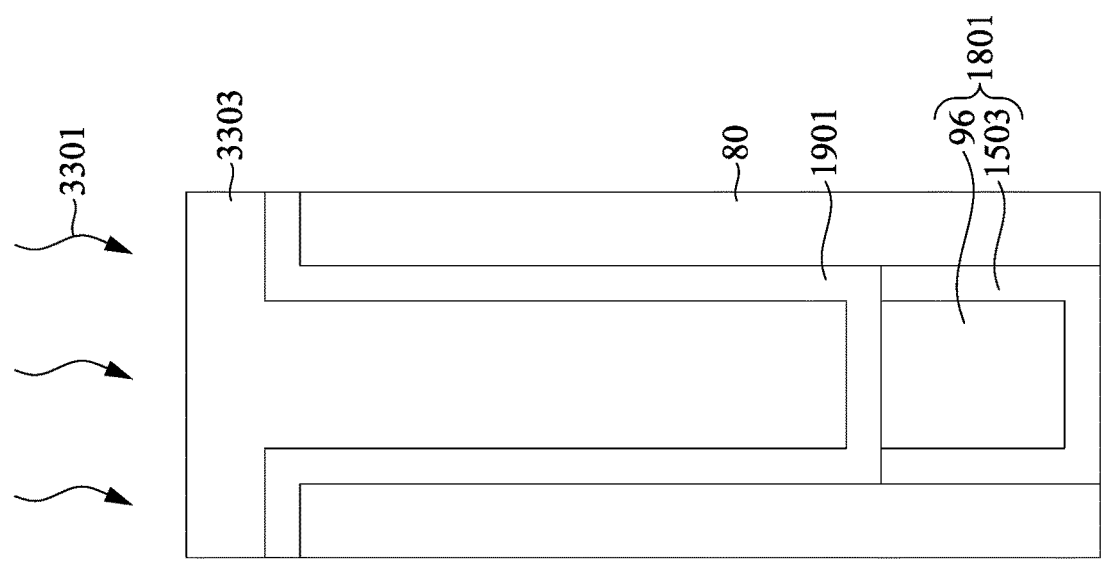

FIGS. 32-33 illustrate yet another embodiment in which the first voids 2601 are formed and then removed. Looking first at FIG. 32, in this embodiment, the second gate mask material 2001 is deposited with the first portion 2603 (along with the first void 2601) and the second portion 2605 as described above with respect to FIG. 26. For example, the second gate mask material 2001 is deposited using a deposition process such as atomic layer deposition, chemical vapor deposition, physical vapor deposition, combinations of these, or the like. However, by using one of these processes (instead of the enhanced gap-fill methods), and continuing the deposition process past the embodiment described above with respect to FIG. 29, when the second gate mask material 2001 is deposited, the first void 2601 or seam is again formed in the first portion 2603 of the second gate mask material 2001 as material grows from each side of the first trench 1701.

In this embodiment the deposition process is continued until the first void 2601 has a width that can be closed in a subsequent process (described below with respect to FIG. 33). For example, in an embodiment the deposition process may be continued until the first void 2601 has a fourth width W$_4$ that is between about 0.5 nm and about 1.5 nm. If the first void 2601 has a fourth width W$_4$ that is larger than 1.5 nm, the gap will not be closed in subsequent processes. However, any suitable widths may be utilized.

Turning now to FIG. 33, in this embodiment a second treatment process (represented in FIG. 33 by the wavy lines labeled 3301) may be performed in order to expand the material of the first portion 2603, close the first void 2601, and form an expanded second gate mask material 3303. In an embodiment the second treatment process 3301 may be an annealing process in an ambient environment that helps to enhance the expansion of the first portion 2603. For example, in a particular embodiment the second treatment process 3301 may be an annealing process at a temperature of between about 300° C. and about 900° C. in an ambient atmosphere comprising water vapor, O$_2$, N$_2$, combinations of these, or the like, for a time of between about 10 min and about 600 min. However, any suitable annealing process and any suitable ambient environment may be utilized.

Once the first voids 2601 have been closed, the remainder of the manufacturing steps may be performed as described above with respect to FIGS. 21-25 to manufacture the capping layer 2501. For example, the expanded second gate mask material 3303 may be recessed, the third liner 2301 may be deposited into the recess, the third liner 2301 and the second liner 1901 may be planarized, and the third liner 2301 and the second liner 1901 may be crystallized as described above with respect to FIGS. 22-25.

Figure 34A:
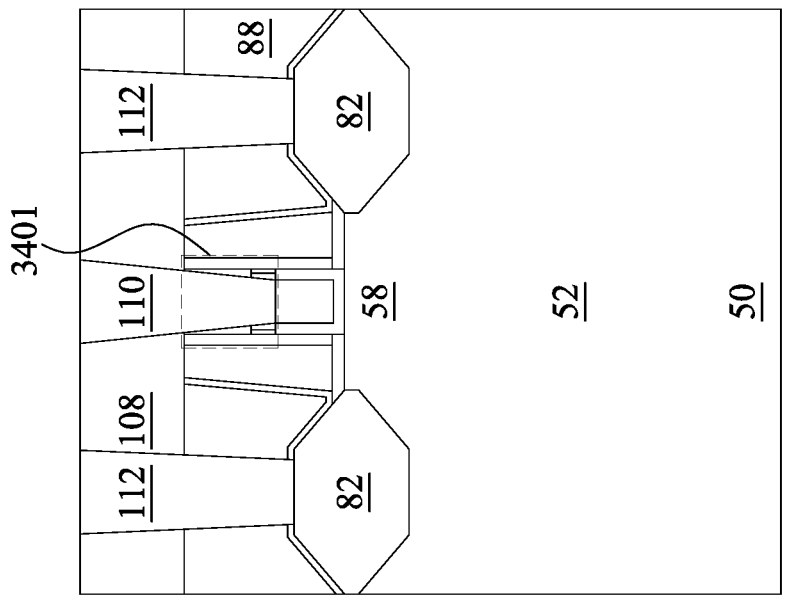
Figure 34B:
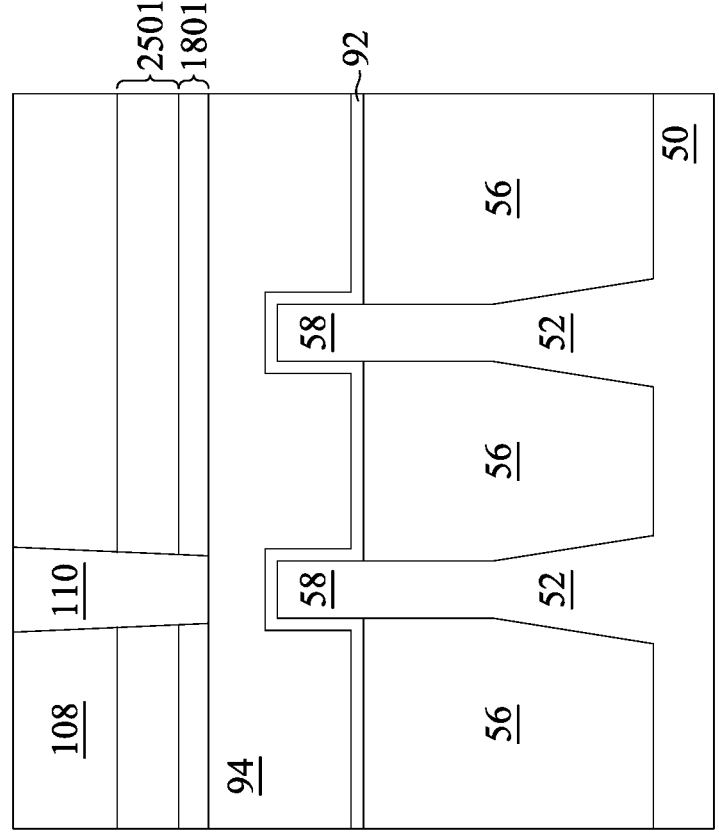

Turning now to FIGS. 34A and 34B, once the third liner 2301 and the second liner 1901 have been crystallized (regardless of which embodiment described above is used), a second ILD 108 is deposited over the first ILD 88. In some embodiments, the second ILD 108 is a flowable film formed by a flowable CVD method. In some embodiments, the second ILD 108 is formed of a dielectric material such as PSG, BSG, BPSG, USG, or the like, and may be deposited by any suitable method, such as CVD and PECVD. The subsequently formed gate contacts 110 penetrate through the second ILD 108, the first gate mask 1801, and the first capping layer 2501 to contact the top surface of the recessed gate electrode 94.

Figure 34C:
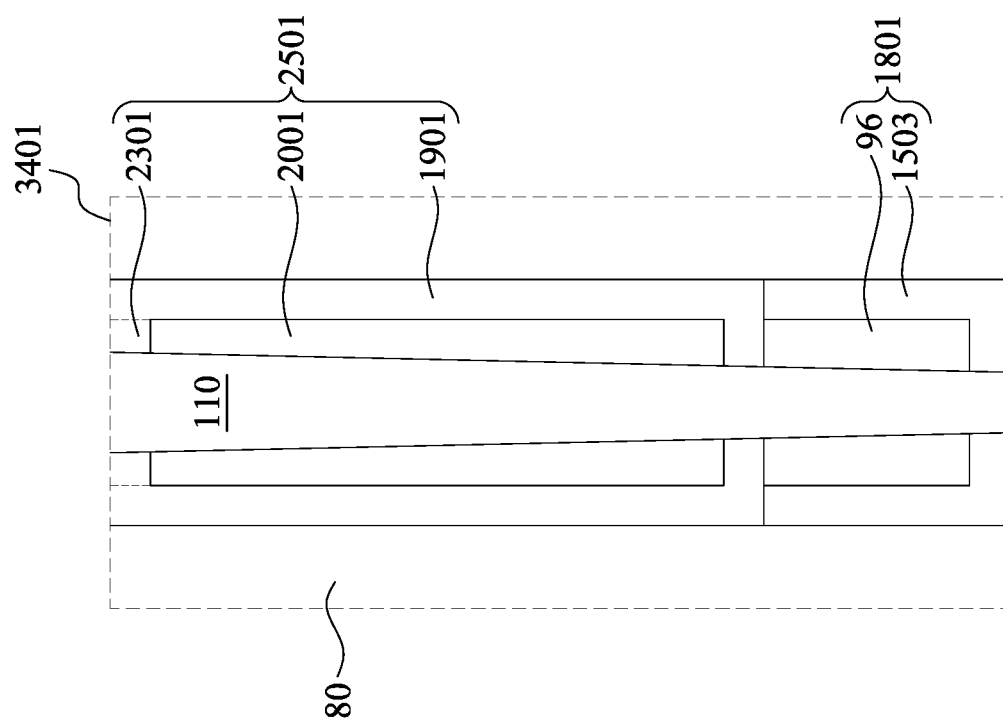

In FIGS. 34A, 34B and 34C, gate contacts 110 and source/drain contacts 112 are formed through the second ILD 108 and the first ILD 88 in accordance with some embodiments. Openings for the source/drain contacts 112 are formed through the first and second ILDs 88 and 108, and openings for the gate contact 110 are formed through the second ILD 108, the first gate mask 1801, and the first capping layer 2501. The openings may be formed using acceptable photolithography and etching techniques. A liner (not shown), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 108. The remaining liner and conductive material form the source/drain contacts 112 and gate contacts 110 in the openings. An anneal process may be performed to form a silicide at the interface between the epitaxial source/drain regions 82 and the source/drain contacts 112. The source/drain contacts 112 are physically and electrically coupled to the epitaxial source/drain regions 82, and the gate contacts 110 are physically and electrically coupled to the gate electrodes 94. The source/drain contacts 112 and gate contacts 110 may be formed in different processes, or may be formed in the same process. Although shown as being formed in the same cross-sections, it should be appreciated that each of the source/drain contacts 112 and gate contacts 110 may be formed in different cross-sections, which may avoid shorting of the contacts.

FIG. 34C is a close up view of the dashed box 3401 in FIG. 34B. As can be seen in this figure, the gate contacts 110 extend through the third liner 2301, the second gate mask material 2001, and the second liner 1901. The gate contacts 110 additionally extend through the first gate mask material 96 and the first liner 1503 to make contact with the underlying gate electrode 94.

The disclosed FinFET embodiments could also be applied to nanostructure devices such as nanostructure (e.g., nanosheet, nanowire, gate-all-around, or the like) field effect transistors (NSFETs). In an NSFET embodiment, the fins are replaced by nanostructures formed by patterning a stack of alternating layers of channel layers and sacrificial layers. Dummy gate stacks and source/drain regions are formed in a manner similar to the above-described embodiments. After the dummy gate stacks are removed, the sacrificial layers can be partially or fully removed in channel regions. The replacement gate structures are formed in a manner similar to the above-described embodiments, the replacement gate structures may partially or completely fill openings left by removing the sacrificial layers, and the replacement gate structures may partially or completely surround the channel layers in the channel regions of the NSFET devices. ILDs and contacts to the replacement gate structures and the source/drain regions may be formed in a manner similar to the above-described embodiments. A nanostructure device can be formed as disclosed in U.S. Patent Application Publication No. 2016/0365414, which is incorporated herein by reference in its entirety.

By manufacturing the first capping layer 2501 as described, the first capping layer 2501 can be formed without the presence of voids within the final structure. As such, the crystallized materials can be utilized to obtain the desired etch resistance while avoiding the defects associated with voids caused by volume shrinkage and surface tension balance. As such, a manufacturing process with fewer defects can be achieved.

In accordance with an embodiment, a method of manufacturing a semiconductor device, the method includes: forming a gate structure in a gate trench, the gate structure comprising a gate electrode and a first gate mask overlying the gate electrode; forming a first liner layer in the gate trench above the gate structure; forming a second gate mask material in the gate trench and above the first liner layer; etching the second gate mask material such that a top surface of the second gate mask material is lower than a top surface of the first liner layer; forming a second liner layer overlying the first liner layer and the second gate mask material; and performing a crystallization process on the first liner layer and the second liner layer. In an embodiment the forming the second gate mask material further includes: depositing a first portion of the second gate mask material over a second portion of the second gate mask material, wherein after the depositing the first portion the first portion has a void at a first location and the second portion of the second gate mask material has no voids; removing the first portion of the second gate mask material to a point below the first location, wherein after the removing the first portion the second gate mask material has no voids; and depositing a third portion of the second gate mask material after the removing the first portion. In an embodiment the forming the second gate mask material further includes: depositing a first portion of the second gate mask material, wherein after the depositing the first portion the first portion has a void; and expanding the first portion to close the void. In an embodiment the forming the second gate mask material is performed at least in part with a flowable deposition process or a spin on process. In an embodiment the forming the second gate mask material further includes: depositing a first portion of the second gate mask material, the depositing the first portion forming a conformal layer; reshaping the first portion; and depositing a second portion of the second gate mask material after the reshaping the first portion. In an embodiment the reshaping the first portion reshapes the first portion into a V-shape. In an embodiment the reshaping the first portion is performed at least in part with a plasma treatment.

In accordance with another embodiment, a method of manufacturing a semiconductor device, the method includes: forming a first gate electrode over a semiconductor fin; forming a first capping layer over the first gate electrode within a first opening of a dielectric layer; forming a first liner within the first opening over the first capping layer; forming a void-free second gate mask material within the first opening over the first liner; and forming a second liner within the first opening over the void-free second gate mask material. In an embodiment the forming the void-free second gate mask material is performed at least in part with a flowable process. In an embodiment the forming the void-free second gate mask material further includes: forming a first portion of the second gate mask material, the first portion comprising a void; and etching the first portion of the second gate mask material to remove material surrounding the void; and forming a second portion of the second gate mask material after the etching the first portion. In an embodiment the forming the void-free second gate mask material further includes: forming a first portion of the second gate mask material, the first portion comprising a void; and adding water to the first portion to seal the void. In an embodiment the forming the void-free second gate mask material further includes: forming a conformal first portion of the second gate mask material; and reshaping the first portion of the second gate mask material; and forming a second portion of the second gate mask material after the reshaping the first portion. In an embodiment the method further includes crystallizing the first liner and the second liner. In an embodiment the first liner comprises hafnium oxide and the second liner comprises hafnium oxide.

In accordance with yet another embodiment, a method of manufacturing a semiconductor device, the method includes: forming a gate electrode over a semiconductor fin; forming a first capping layer over the gate electrode; and forming a second capping layer over the first capping layer, the second capping layer including: a first liner; a second capping layer material, the second capping layer material being free from voids; and a second liner over the second capping layer material, the second liner being coplanar with a dielectric layer. In an embodiment, the first liner comprises hafnium oxide. In an embodiment, the first liner is crystallized. In an embodiment, the second liner comprises hafnium oxide. In an embodiment, the second liner is crystallized. In an embodiment, the second capping layer comprises silicon oxycarbide.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
    forming a gate structure in a gate trench overlying a semiconductor fin, the gate structure comprising a gate electrode and a first gate mask overlying the gate electrode;
    forming a first liner layer in the gate trench above the gate structure;
    forming a second gate mask material in the gate trench and above the first liner layer;
    etching the second gate mask material such that a top surface of the second gate mask material is lower than a top surface of the first liner layer;
    forming a second liner layer overlying the first liner layer and the second gate mask material; and
    using a crystallization process to simultaneously crystallize the first liner layer and the second liner layer.

2. The method of claim 1, wherein the forming the second gate mask material further comprises:
    depositing a first portion of the second gate mask material over a second portion of the second gate mask material, wherein after the depositing the first portion the first portion has a void at a first location and the second portion of the second gate mask material has no voids;
    removing the first portion of the second gate mask material to a point below the first location, wherein after the removing the first portion the second gate mask material has no voids; and
    depositing a third portion of the second gate mask material after the removing the first portion.

3. The method of claim 1, wherein the forming the second gate mask material further comprises:
    depositing a first portion of the second gate mask material, wherein after the depositing the first portion the first portion has a void; and
    expanding the first portion to close the void.

4. The method of claim 1, wherein the forming the second gate mask material is performed at least in part with a flowable deposition process or a spin on process.

5. The method of claim 1, wherein the forming the second gate mask material further comprises:
    depositing a first portion of the second gate mask material, the depositing the first portion forming a conformal layer;
    reshaping the first portion; and
    depositing a second portion of the second gate mask material after the reshaping the first portion.

6. The method of claim 5, wherein the reshaping the first portion reshapes the first portion into a V-shape.

7. The method of claim 5, wherein the reshaping the first portion is performed at least in part with a plasma treatment.

8. The method of claim 1, wherein the first liner layer comprises hafnium oxide.

9. A method of manufacturing a semiconductor device, the method comprising:
    forming a first gate electrode over a semiconductor fin;
    forming a first capping layer over the first gate electrode within a first opening of a dielectric layer;
    forming a first liner within the first opening over the first capping layer;
    forming a void-free second gate mask material within the first opening over the first liner;
    forming a second liner within the first opening over the void-free second gate mask material; and
    crystallizing the first liner and the second liner.

10. The method of claim 9, wherein the forming the void-free second gate mask material is performed at least in part with a flowable process.

11. The method of claim 9, wherein the forming the void-free second gate mask material further comprises:
    forming a first portion of the second gate mask material, the first portion comprising a void;
    etching the first portion of the second gate mask material to remove material surrounding the void; and
    forming a second portion of the second gate mask material after the etching the first portion.

12. The method of claim 9, wherein the forming the void-free second gate mask material further comprises:
    forming a first portion of the second gate mask material, the first portion comprising a void; and
    adding water to the first portion to seal the void.

13. The method of claim 9, wherein the forming the void-free second gate mask material further comprises:
    forming a conformal first portion of the second gate mask material;
    reshaping the first portion of the second gate mask material; and
    forming a second portion of the second gate mask material after the reshaping the first portion.

14. The method of claim 9, wherein the first liner comprises hafnium oxide and the second liner comprises hafnium oxide.

15. A method of manufacturing a semiconductor device, the method comprising:
    forming a gate electrode in a trench located over a semiconductor fin;
    forming a first capping layer over the gate electrode; and
    forming a second capping layer over the first capping layer, the second capping layer comprising:
        a first liner;
        a second capping layer material, the second capping layer material being free from voids; and
        a second liner over the second capping layer material, the second liner being coplanar with a dielectric layer, wherein during the forming the second capping layer the first liner and the second liner are simultaneously crystallized.

16. The method of claim 15, wherein the first liner comprises hafnium oxide.

17. The method of claim 16, wherein the first liner is crystallized.

18. The method of claim 17, wherein the second liner comprises hafnium oxide.

19. The method of claim 18, wherein the second liner is crystallized.

20. The method of claim 15, wherein the second capping layer comprises silicon oxycarbide.

\* \* \* \* \*